US012777848B2

(12) United States Patent
Ng et al.

(10) Patent No.: US 12,777,848 B2
(45) Date of Patent: Oct. 27, 2026

(54) PIEZOELECTRIC DEVICE AND METHOD OF FORMING THE SAME

(71) Applicant: AGENCY FOR SCIENCE, TECHNOLOGY AND RESEARCH, Singapore (SG)

(72) Inventors: Eldwin Jiaqiang Ng, Singapore (SG); Nan Wang, Singapore (SG); Srinivas Merugu, Singapore (SG); Jaibir Sharma, Singapore (SG)

(73) Assignee: AGENCY FOR SCIENCE, TECHNOLOGY AND RESEARCH, Singapore (SG)

( * ) Notice: Subject to any disclaimer, the term of this patent is extended or adjusted under 35 U.S.C. 154(b) by 658 days.

(21) Appl. No.: 18/044,493

(22) PCT Filed: Sep. 23, 2021

(86) PCT No.: PCT/SG2021/050577

§ 371 (c)(1),
(2) Date: Mar. 8, 2023

(87) PCT Pub. No.: WO2022/081085

PCT Pub. Date: Apr. 21, 2022

(65) Prior Publication Data

US 2024/0032429 A1 Jan. 25, 2024

(30) Foreign Application Priority Data

Oct. 14, 2020 (SG) ........................... 10202010189U

(51) Int. Cl.
*H10N 30/20* (2023.01)
*H10N 30/076* (2023.01)
*H10N 30/853* (2023.01)

(52) U.S. Cl.
CPC ....... *H10N 30/2047* (2023.02); *H10N 30/076* (2023.02); *H10N 30/853* (2023.02)

(58) Field of Classification Search
CPC ............. H10N 30/2047; H10N 30/076; H10N 30/853; H10N 30/308; G01P 15/0922
(Continued)

(56) References Cited

U.S. PATENT DOCUMENTS 4,961,252 A 10/1990 Hsu et al.
6,542,285 B1 4/2003 Batchko et al.
(Continued)

FOREIGN PATENT DOCUMENTS

CN 107093664 A 8/2017
WO 2018063358 A1 4/2018

OTHER PUBLICATIONS

International Search Report for International Application No. PCT/SG2021/050577 mailed Dec. 13, 2021 (2 pages).
(Continued)

*Primary Examiner* — Richard Tan

(57) ABSTRACT

Various embodiments may relate to a piezoelectric device. The piezoelectric device may include a substrate, and a layered stacked arrangement anchored to the substrate. The layered stacked arrangement may include a piezoelectric layer. The stacked arrangement may also include a first electrode on a first side of the piezoelectric layer. The stacked arrangement may further include a second electrode on a second side of the piezoelectric layer opposite the first side. The piezoelectric layer may include a first region including one or more dipole domains of a first type, and one or more dipole domains of a second type. The first electrode may be at least partially in contact with the first region and at least partially in contact with the second region.

19 Claims, 28 Drawing Sheets

(58) Field of Classification Search
USPC .......................................................... 331/155
See application file for complete search history.

(56) References Cited

U.S. PATENT DOCUMENTS

| | | | |
|---|---|---|---|
| 7,053,532 | B2 | 5/2006 | Lean et al. |
| 7,405,512 | B2 | 7/2008 | Pannell |
| 8,279,557 | B2 | 10/2012 | Kautzky et al. |
| 10,158,063 | B2 | 12/2018 | Lal et al. |
| 2004/0187281 | A1 | 9/2004 | Hsu et al. |
| 2010/0007242 | A1* | 1/2010 | Hori .................... H10N 30/101 310/317 |
| 2011/0037351 | A1 | 2/2011 | Kasai et al. |
| 2011/0148252 | A1 | 6/2011 | Li et al. |
| 2014/0292155 | A1 | 10/2014 | Ballandras et al. |
| 2015/0054387 | A1 | 2/2015 | Li |

OTHER PUBLICATIONS

Akhbari et al. "Bimorph PMUT with Dual Electrodes," MEMS 2015 (Jan. 2015) pp. 928-931.

Wang et al. "A MEMS piezoelectric in-plane resonant accelerometer based on aluminum nitride with two-stage microleverage mechanism," Sensors and Actuators, vol. A 254, 2017, pp. 126-133.

Bhatt et al. "Control of Intrinsic Defects in Lithium Niobate Single Crystal for Optoelectronic Applications," Crystals 2017, vol. 7, No. 23, pp. 1-20.

Shao et al. "Ferroelectric domain inversion and its stability in lithium niboate thing film on insulator with different thicknesses," Research Article AIP Advances, vol. 6, 2016, pp. 1-9.

Li et al. "Effects of electrical boundary conditions and poling approaches on the mechanical depolarization behavior of PZT ceramics," Acta Materilia vol. 53, 2005, pp. 2665-2673.

Fichtner et al., "AIScN: A III-V semiconductor based," J. Appl. Phys. 125, p. 114103, 2019.

Nakamura et al., "An Ultrasonic Transducer for Second Harmonic Imaging Using a LiNbO3 Plate with a Local Ferroelectric Inversion Layer," IEEE Transactions on Ultrasonics, Ferroelectrics, and Frequency Control, vol. 53, No. 3, pp. 651-655, 2006.

Yamada et al., "First-order quasi-phase matched LiNbO3 waveguide periodically poled by applying an external field for efficient blue secondharmonic generation," Appl. Phys. Lett., vol. 62, p. 435, 1993.

* cited by examiner

Remove the temporary electrode

Deposit a final top electrode of a different geometry from the temporary electrode Unimorph structure: easy to fabricate but low performance Surface: Total displacement (µm)

- PRIOR ART -

- PRIOR ART -

| | Output Voltage (mV) | Capacitance (pF) | Output Charge (fC) |
|---|---|---|---|
| Conventional | 4.9 | 1.6 | 8.0 |
| Inverted Poling | 9.2 | 2.3 | 21 |

Start with a silicon-on-insulator substrate

Etch trenches in the device layer to define the springs and proof mass

PIEZOELECTRIC DEVICE AND METHOD OF FORMING THE SAME

CROSS-REFERENCE TO RELATED APPLICATION

This application is a National Stage Application of PCT/SG2021/050577 filed Sep. 23, 2021, which claims the benefit of priority of Singapore application Ser. No. 10/202,010189U filed Oct. 14, 2020, the contents of each being hereby incorporated herein by reference in their entireties for all purposes. To the extent appropriate, a claim of priority is made to each of the above disclosed application(s).

TECHNICAL FIELD

Various embodiments of this disclosure may relate to a piezoelectric device. Various embodiments of this disclosure may relate to a method of forming a method of forming a piezoelectric device.

BACKGROUND

Piezoelectric materials are commonly used in transducers, where the application of a mechanical stress results in an electrical charge generated (piezoelectric effect), or where an applied electric field results in a mechanical deformation (inverse piezoelectric effect). Some piezoelectric materials are additionally ferroelectric, where the piezoelectric polarization of the material can be altered by a large externally applied electric field.

Examples of ferroelectric materials are lead zirconate titanate ($Pb[Zr_xTi_{1-x}]O_3$ or PZT), barium titanate ($BaTiO_3$), lead titanate ($PbTiO_3$), lithium niobate ($LiNbO_3$), and lithium tantalite ($LiTaO_3$), while examples of non-ferroelectric materials include zinc oxide (ZnO) and aluminium nitride (AlN). However, ferroelectric properties have also recently been discovered in scandium-doped aluminium nitride ($Sc_xAl_{1-x}N$) with high Sc content, with other similar materials in the wurtzite-type-III-nitride class conjectured to have similar ferroelectric properties.

Some ferroelectrics (such as crystalline $LiNbO_3$) naturally possess a crystalline anisotropy and naturally exhibit piezoelectric properties caused by electric dipoles aligned in the same direction. The dipole domains may be aligned (poling) in the opposite direction by the application of strong electric fields or by the addition of dopants. Other ferroelectrics (such as PZT) may have domains that are typically randomly aligned as fabricated, and may need to be poled in order to exhibit piezoelectric properties.

Having differently poled domains within the same ferroelectric layer is common in the optics domain where periodically poled ferroelectrics such as $LiNbO_3$. Periodically Poled Lithium Niobate (PPLN) are used for optical frequency conversion or other non-linear functions. By selecting an appropriate periodicity of the domain inversion, the optical phases can be tuned for constructive interference.

In the area of microelectromechanical systems (MEMS), piezoelectrics offer an excellent transduction mechanism for electromechanical coupling, and are used for numerous types of devices such as sensors, actuators, and resonators. Thin-film piezoelectrics (~um thickness) can be deposited on wafers by processes such as layer transfer, sol-gel, or physical vapor deposition (PVD), techniques. These piezoelectric layers can be patterned and electrodes added using microfabrication techniques to define mechanically movable structures.

SUMMARY

Various embodiments may relate to a piezoelectric device. The piezoelectric device may include a substrate. The piezoelectric device may include a layered stacked arrangement anchored to the substrate. The layered stacked arrangement may include a piezoelectric layer. The stacked arrangement may also include a first electrode on a first side of the piezoelectric layer. The stacked arrangement may further include a second electrode on a second side of the piezoelectric layer opposite the first side. The piezoelectric layer may include a first region including one or more dipole domains of a first type. The piezoelectric layer may include a second region including one or more dipole domains of a second type. The first electrode may be at least partially in contact with the first region and at least partially in contact with the second region. The second electrode may be at least partially in contact with the first region and at least partially in contact with the second region. The piezoelectric device may be a sensor or an actuator. During operation, at least 50% of the first region may be configured to have a positive curvature and at least 50% of the second region may be configured to have a negative curvature.

Various embodiments may relate to a method of forming a piezoelectric device. The method may include forming a layered stacked arrangement anchored to the substrate. The layered stacked arrangement may include a piezoelectric layer; a first electrode on a first side of the piezoelectric layer; and a second electrode on a second side of the piezoelectric layer opposite the first side. The piezoelectric layer may include a first region including one or more dipole domains of a first type. The piezoelectric layer may also include a second region including one or more dipole domains of a second type. The first electrode may at least be partially be in contact with the first region and at least partially be in contact with the second region. The second electrode may at least partially be in contact with the first region and at least partially be in contact with the second region. The piezoelectric device may be a sensor or an actuator. During operation, at least 50% of the first region may be configured to have a positive curvature and at least 50% of the second region may be configured to have a negative curvature.

BRIEF DESCRIPTION OF THE DRAWINGS

In the drawings, like reference characters generally refer to the same parts throughout the different views. The drawings are not necessarily drawn to scale, emphasis instead generally being placed upon illustrating the principles of various embodiments. In the following description, various embodiments of the invention are described with reference to the following drawings.

DESCRIPTION

The following detailed description refers to the accompanying drawings that show, by way of illustration, specific details and embodiments in which the invention may be practised. These embodiments are described in sufficient detail to enable those skilled in the art to practise the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the piezoelectric devices are analogously valid for the other piezoelectric devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles “a”, “an” and “the” as used with regard to a feature or element include a reference to one or more of the features or elements.

In the context of various embodiments, the term “about” or “approximately” as applied to a numeric value encompasses the exact value and a reasonable variance.

As used herein, the term “and/or” includes any and all combinations of one or more of the associated listed items.

Figure 1:
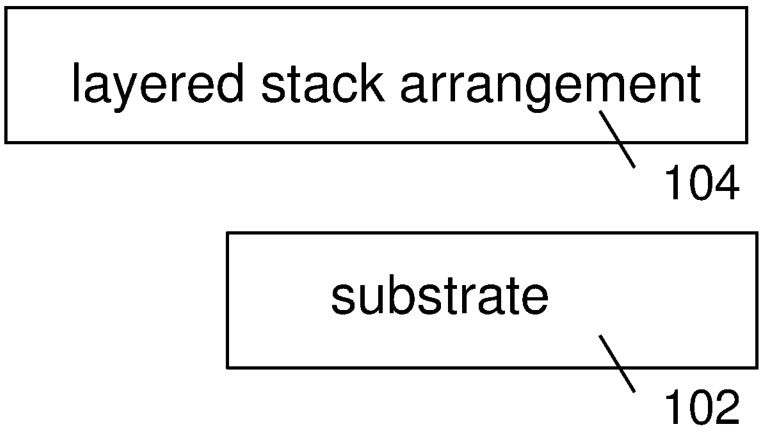
FIG. 1 is a general illustration of a piezoelectric device according to various embodiments.

FIG. 1 is a general illustration of a piezoelectric device according to various embodiments. The piezoelectric device may include a substrate 102. The piezoelectric device may include a layered stacked arrangement 104 anchored to the substrate 102. In other words, at least a portion of the layered stacked arrangement 104 may be anchored to the substrate. Another portion of the layered stacked arrangement 104 may be suspended. The layered stacked arrangement 104 may include a piezoelectric layer. The stacked arrangement 104 may also include a first electrode on a first side of the piezoelectric layer. The stacked arrangement 104 may further include a second electrode on a second side of the piezoelectric layer opposite the first side. The piezoelectric layer may include a first region including one or more dipole domains of a first type. The piezoelectric layer may include a second region including one or more dipole domains of a second type. The first electrode may be at least partially in contact with the first region and at least partially in contact with the second region. The second electrode may be at least partially in contact with the first region and at least partially in contact with the second region. The piezoelectric device may be a sensor or an actuator. During operation, at least 50% of the first region may be configured to have a positive curvature and at least 50% of the second region may be configured to have a negative curvature.

In other words, the piezoelectric device may be a sensor or an actuator including a stacked arrangement 104 partially coupled to a substrate 102. The stacked arrangement may include a piezoelectric layer having dipole domains of different types, and two electrodes on opposite sides of the piezoelectric layer. Both electrodes may each extend over a dipole domain of a first type and a dipole domain of a second type. During operation, a substantial portion of the first region may have a positive curvature, and a substantial portion of the second region may have a negative curvature.

For avoidance of doubt, FIG. 1 illustrates the features of the piezoelectric device according to various embodiments, and is not intended to limit the arrangement, orientation, shape, size etc. of these features.

Various embodiments may seek to maximize device transduction while addressing electrode routing difficulties. Many piezoelectric devices such as inertial or acoustic transducers are based on flexural transduction mechanisms such as fixed-guided beams or membranes that operate with movable regions of opposite curvature. These regions either require opposing signals for actuation or generate opposing signals for sensing. Often, part of the transduction capability is sacrificed for simplicity in the device architecture, where over regions with curvatures in the same direction are utilized. Even so, electrical routing over the opposing regions may result in cancellation effects. To obtain maximum transduction, the first and second electrodes over the regions of opposing curvature need to be electrically isolated from each other. Electrical vias may be required to connect the electrode pairs across the different regions. These increase the fabrication process complexities and are often not possible due to fabrication process limitations (such as minimum patternable feature size, or patterned bottom electrodes with steps causing piezoelectric defects or poor performance).

The piezoelectric layer may be a ferroelectric layer. In various embodiments, the one or more dipole domains of the first type may be aligned in a first direction. The one or more dipole domains of the second type may be aligned in a second direction opposite the first direction.

In various embodiments, the one or more dipole domains of the first type and/or the one or more dipole domains of the second type may be non-uniformly poled.

In various embodiments, the piezoelectric device may have one anchor anchoring the layered stacked arrangement 104 anchored to the substrate 102. In various other embodiments, the piezoelectric device may have two or more anchors anchoring the layered stacked arrangement 104 anchored to the substrate 102. In one example, the layered stacked arrangement 104 may be a diaphragm supported by the substrate 102 all around the edge of the diaphragm.

In various embodiments, the first electrode and/or the second electrode may be an elastic layer. The first electrode and/or the second electrode may be a doped elastic layer, e.g. a doped silicon layer that is elastic. The doped elastic layer may also act as an electrically conductive electrode.

In various embodiments, the stacked arrangement may include a further layer such that the first electrode or the second electrode is between the piezoelectric layer and the further layer.

In various embodiments, the further layer may be electrically conductive or electrically semi-conductive. The further layer may include an electrically conductive material such as aluminium, platinum, molybdenum, gold, or doped silicon, or a semi-conductive material such as (undoped) silicon or (undoped) germanium. In the case in which the first electrode is between the piezoelectric layer and the further layer, the first electrode may be in electrical contact with the further layer. In the case in which the second electrode is between the piezoelectric layer and the further layer, the second electrode may be in electrical contact with the further layer.

In various other embodiments, the further layer may be electrically insulating. The further layer may include an electrically insulating material such as silicon dioxide or silicon nitride.

In yet various other embodiments, the further layer may be a further piezoelectric layer. The further layer may be a ferroelectric layer.

In various embodiments, the piezoelectric layer and/or the further piezoelectric layer may be polycrystalline.

In various embodiments, the piezoelectric layer may further include a gap material between the first region and the second region. In various embodiments, piezoelectric device or the piezoelectric layer may include a gap between the first region and the second region. The gap may be partially or fully filled with the gap material. The gap material may have a dielectric constant lower than a dielectric constant of a piezoelectric material of the piezoelectric layer. For instance, the gap material may be a low dielectric constant material (low-k dielectric), i.e. a material having a lower dielectric constant relative to the material of the piezoelectric layer, such as silicon oxide or silicon nitride, or polyimide. In various other embodiments, the gap may be a vacuum or an air gap (i.e. a gap filled with air), and may not contain the gap material. Various embodiments may provide better isolation of the electric fields between the two regions, during the poling step, as well as during device operation. This improved isolation may result in better control of the electric fields and alignment of the dipole domains, and hence higher performance devices.

In reported applications of resonators and optics with domain inversions, gaps in the piezoelectric are undesirable for optics or resonators as these are typically considered defects that lower the device performance, such as increasing energy losses. Grain boundaries of polycrystalline materials are also not preferable. However, for flexural mode applications, the energy losses may often be dominated by other effects, and may even be desired, such as the transfer of energy to the acoustic medium for piezoelectric micromachined ultrasonic transducers (pMUTs). Therefore, gap-free or single-crystal materials provide negligible benefits. There may instead be beneficial effects to having gaps for the inverted poling structure, such as: a) providing increased electrical isolation during poling for more controlled inversion, b) providing a larger net actuation or sensitivity with the well-defined poling, and/or c) providing a lesser likelihood for domain depolarization for smaller domains/thinner layers. It may also be easier to deposit thin-films of polycrystalline materials compared with single crystal materials.

In various embodiments, the piezoelectric layer and/or the further piezoelectric layer may include a ferroelectric material, e.g. scandium aluminium nitride (ScAlN), or lead zirconate titanate (PZT). In various embodiments, the piezoelectric layer and/or the further piezoelectric layer may have a thickness of a value less than 5 μm.

Literature reports that some ferroelectric materials such as lead zirconate titanate (PZT) can be depolarized by electric fields, mechanical stresses, or by heat. Inverted polarizations of lithium niobate thin-films may also be poorly retained for thin layer and/or small domains. During microfabrication processing steps such as reactive ion etching, high electric fields or temperatures can be applied that can depolarize the ferroelectric materials. Maintaining the polarization may be critical during processing subsequent processing steps such as the modification of the second electrode.

Other ferroelectric materials may be applicable, such as wurtzite-structure materials like scandium aluminium nitride (ScAlN), which can be readily deposited as thin-films. While the higher coercive field (around ~MV/cm for ScAlN, compared to ~100 kV/cm for PZT) typically makes it much more difficult to change the poling electrically, ScAlN with differently poled regions may also be less sensitive to heat and electric fields during subsequent processing. Using a material that is more stable to polarization changes allows for the modification of the second electrode and subsequent process steps after poling, and may help to achieve having a single electrode over different dipole domains.

In various embodiments, the first electrode and/or the second electrode may include molybdenum. The molybdenum may be patterned using an isotropic etch. The isotropic etch may be a selective, low-temperature vapor isotropic etch.

Electrode materials that are commonly used for piezoelectric materials such as PZT and ScAlN may include platinum, gold, molybdenum, or aluminium. However, the patterning or removal of these materials over the piezoelectric typically involves ion etching (anisotropic etch), which often risks causing changes to the piezoelectric polarization. Molybdenum may be etched by a xenon difluoride ($XeF_2$) isotropic vapor etch in mild conditions, while not etching piezoelectric materials such as PZT, ScAlN and many key materials such as photoresist, silicon oxide, and most metals. The isotropic etch may result in curved sidewalls. Using molybdenum with a $XeF_2$ isotropic dry etch for patterning the electrode removal reduces the risk of polarization changes during the modification of the second electrode and may aid in achieving a single electrode over different dipole domains.

Various embodiments may couple the domain inversion together with sensing/actuation based on extrinsic properties. Various embodiments may relate to a flexural device, which can be configured for a much broader area of sensing as well as actuation applications (such as acoustic sensors, acceleration sensors, flow sensors, micro mirrors/positioners, piezo switches, pressure/temperature sensors) that could operate at resonance as well as below resonance.

In various embodiments, the piezoelectric device may be a piezoelectric micromachined ultrasonic transducer (pMUT). In various embodiments, the piezoelectric device may be an accelerometer, such as an in-plane accelerometer or an out-of-plane accelerometer. In various embodiments, the piezoelectric device may be a piezoelectric actuator or a piezoelectric sensor.

Figure 2:
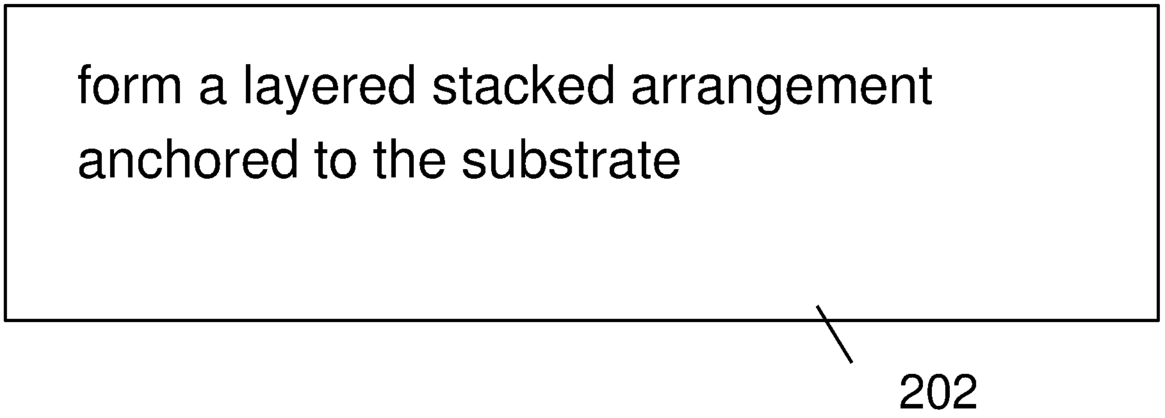
FIG. 2 is a general illustration of a method of forming a piezoelectric device according to various embodiments.

FIG. 2 is a general illustration of a method of forming a piezoelectric device according to various embodiments. The method may include, in 202, forming a layered stacked arrangement anchored to the substrate. In other words, at least a portion of the layered stacked arrangement may be anchored to the substrate. Another portion of the layered stacked arrangement may be suspended. The layered stacked arrangement may include a piezoelectric layer; a first electrode on a first side of the piezoelectric layer; and a second electrode on a second side of the piezoelectric layer opposite the first side. The piezoelectric layer may include a first region including one or more dipole domains of a first type. The piezoelectric layer may also include a second region including one or more dipole domains of a second type. The first electrode may at least be partially be in contact with the first region and at least partially be in contact with the second region. The second electrode may at least partially be in contact with the first region and at least partially be in contact with the second region. The piezoelectric device may be a sensor or an actuator. During operation, at least 50% of the first region may be configured to have a positive curvature and at least 50% of the second region may be configured to have a negative curvature.

In other words, the method may include forming a layered stacked arrangement partially coupled to a substrate. The stacked arrangement may include a piezoelectric layer having dipole domains of different types, and two electrodes on opposite sides of the piezoelectric layer. Both electrodes may each extend over a dipole domain of a first type and a dipole domain of a second type. During operation, a substantial portion of the first region may have a positive curvature, and a substantial portion of the second region may have a negative curvature.

In various embodiments, the first electrode may be formed on a substrate before forming the piezoelectric layer. The method may include forming one or more temporary electrodes on the second side of the piezoelectric layer before forming the second electrode. The one or more temporary electrodes may also be referred to as poling electrodes. The method may also include applying one or more potential differences between the one or more first electrodes and the one or more temporary electrodes (poling) so that the piezoelectric layer includes the first region and the second region.

In various embodiments, the one or more temporary electrodes may be removed before forming the second electrode. In various other embodiments, the one or more temporary electrodes may be modified to form the second electrode, such as by adding a conductive material at locations to join portions of the temporary electrodes.

The process of poling with the one or more temporary electrodes after forming the piezoelectric layer on the substrate may ensure excellent lithographic alignment of the piezoelectric and electrode layers to the underlying structures, which improves the device sensitivity or output.

Although it is possible to bond pre-poled ferroelectric materials such as lithium niobate, bonding has poorer alignment control to the substrate (typically >2 um), compared to <200 nm for lithographic stepper alignment. Additionally, bonding may also result in lower yields compared to thin-film deposition techniques, due to issues such as particle contamination or poor flatness of the layers being bonded.

Various embodiments may have advantages such as: (a) excellent alignment accuracy to underlying layers and patterns, by leveraging standard lithographic alignment techniques, (b) being less susceptible to defects caused by bonding; and (c) allows for multiple simultaneous poling levels or directions with varying finely spaced pitch temporary electrodes.

In various embodiments, the piezoelectric layer may initially be unpoled. In various other embodiments, the piezoelectric layer may initially include dipole domains of only one type. The piezoelectric layer may initially include dipole domains of the first type or of the second type.

In various embodiments, forming the piezoelectric layer may include using a shadow mask for allowing electrical access to the first electrode. In various embodiments, the method further may include etching the piezoelectric layer before forming the second electrode for allowing electrical access to the first electrode.

In various embodiments, the substrate may be patterned before forming the piezoelectric stack. In various other embodiments, the substrate may be a silicon-on-insulator (SOI) wafer.

Various embodiments may relate to a concept of poling a single ferroelectric layer with different domain orientations for MEMS flexural devices, in order to achieve higher performance together with routing ease.

Ferroelectric layers with differently poled domains have been previously discussed for MEMS resonators in single-crystal piezoelectrics and diaphragms. For MEMS resonators, inverting the poling direction according to the resonant mode may provide benefits such as reducing the electrode resistance, increasing the power handling capability, and allowing for higher resonant frequencies. For piezoelectric diaphragms, a piezoelectric diaphragm with domains poled in the radial direction is known.

Figure 3:
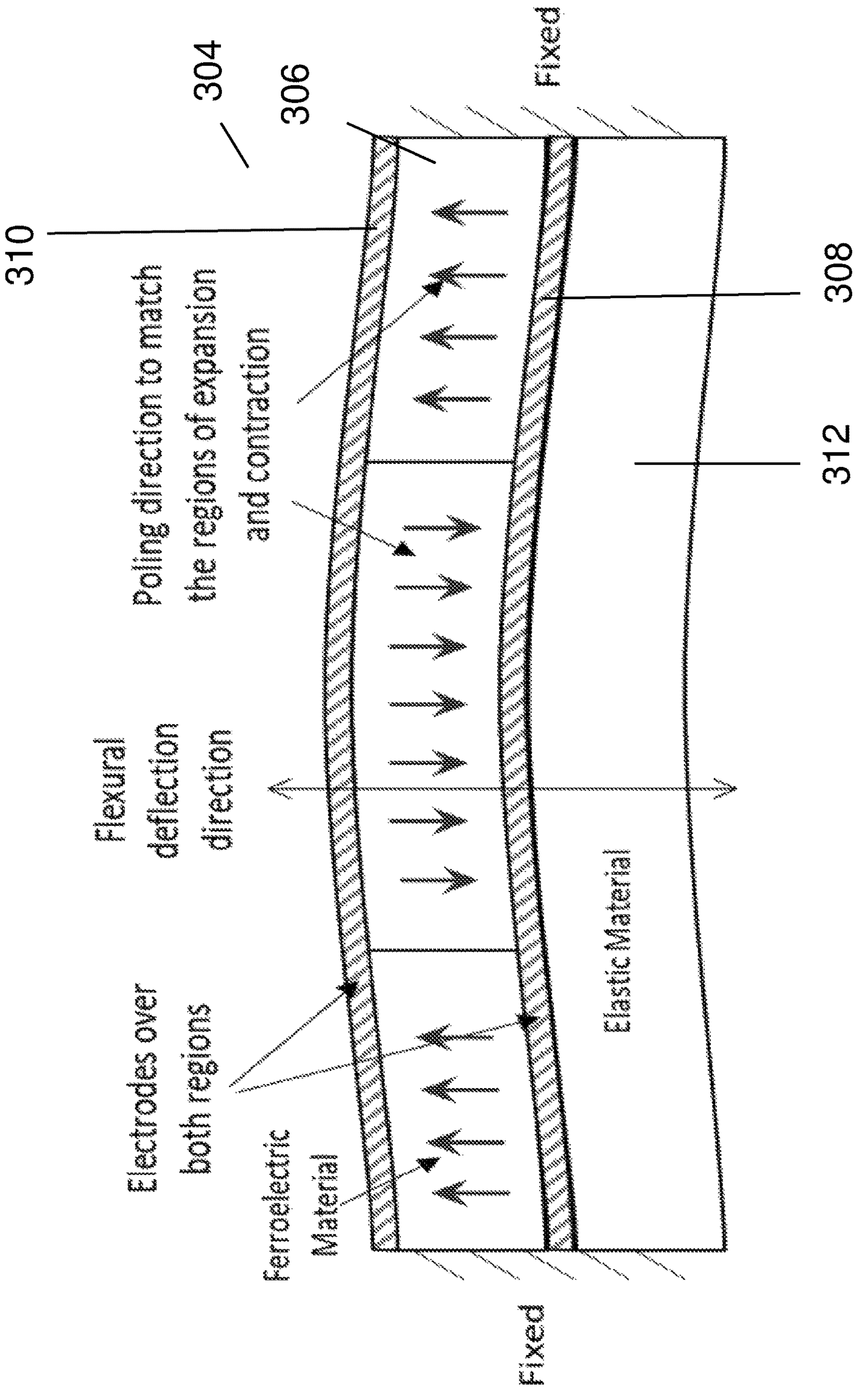
FIG. 3 shows a schematic of a layered stacked arrangement according to various embodiments.

Various embodiments may relate to a flexural structure for MEMS sensors and actuators that includes both inverted and non-inverted piezoelectric domain regions for sensors and actuators. Various embodiments may relate to a method of batch fabricating the structure. The flexural structure may include a piezoelectric layer with a plurality of domain regions that are poled in opposite directions, with the structure operating in a bending mode. This structure may include electrodes on both sides of the piezoelectric film that cover both domains, in order to maximize actuation forces or obtain high sensor response, while allowing for ease of electrode definition without the need for electrically connecting vias across the bottom and top electrodes. This is exemplified in FIG. 3. FIG. 3 shows a schematic of a layered stacked arrangement 304 according to various embodiments. The layered stacked arrangement 304 may be a unimorph beam structure including an active piezoelectric (ferroelectric) layer 306. The layered stacked arrangement may also include a first electrode 308 on a first side of the piezoelectric layer, and a second electrode 310 on a second side of the piezoelectric layer 306 opposite the first side. The layered stacked arrangement may also include a passive elastic layer 312. In various embodiments, the layered stacked arrangement 304 may be bimorph structures where an additional active piezoelectric layer is used in place of the passive elastic layer 312.

Piezoelectric thin-films can be deposited via physical vapour deposition (PVD), and can provide significant advantages compared to single-crystal films. PVD thin films can be deposited at high rates with excellent control of thickness uniformity, with high fabrication yields, compared to crystalline layer transfer or growth methods which may be slow, or limited by substrate flatness and particle contamination. Additionally, PVD also allows the piezoelectric to be deposited over topography onto patterned structures that can ease device fabrication. These PVD films, while typically poled in the out-of-plane direction, are usually also polycrystalline and symmetric in the in-plane directions (transverse isotropy). Compared to single crystals where the properties may vary with the in-plane direction, PVD can provide transversely isotropic mechanical and piezoelectric properties that are advantageous for numerous device designs that require in-plane symmetry. The transverse isotropy may simplify the design and may allow device performance to be optimized readily. PVD of ferroelectric materials such as PZT or ScAlN have been demonstrated.

Two example applications are illustrated herein.

Piezoelectric Micromachined Ultrasonic Transducers (pMUTs)

pMUTs with out-of-plane displacements may also similarly benefit from this scheme. These are microdevices used for generating and/or sensing acoustic waves—the piezoelectric effect may generate an electrical signal for sensing when an acoustic wave impinges upon the transducer. Conversely, the inverse piezoelectric effect may be used for actuation, converting an electrical signal to a mechanical displacement and generating an acoustic wave. Applications for pMUTs include ranging, non-destructive testing, medical ultrasonic imaging, biometrics, as well as power delivery. For ranging or power delivery applications, an array of pMUTs electrically addressed together (single channel) may be used, where the array helps to boost the output pressure or receive sensitivity. For imaging applications or where better acoustic wave control is required, an array of individually addressable transducers (multi-channel) may be required for beamforming or reconstructing an image.

Figure 4A:
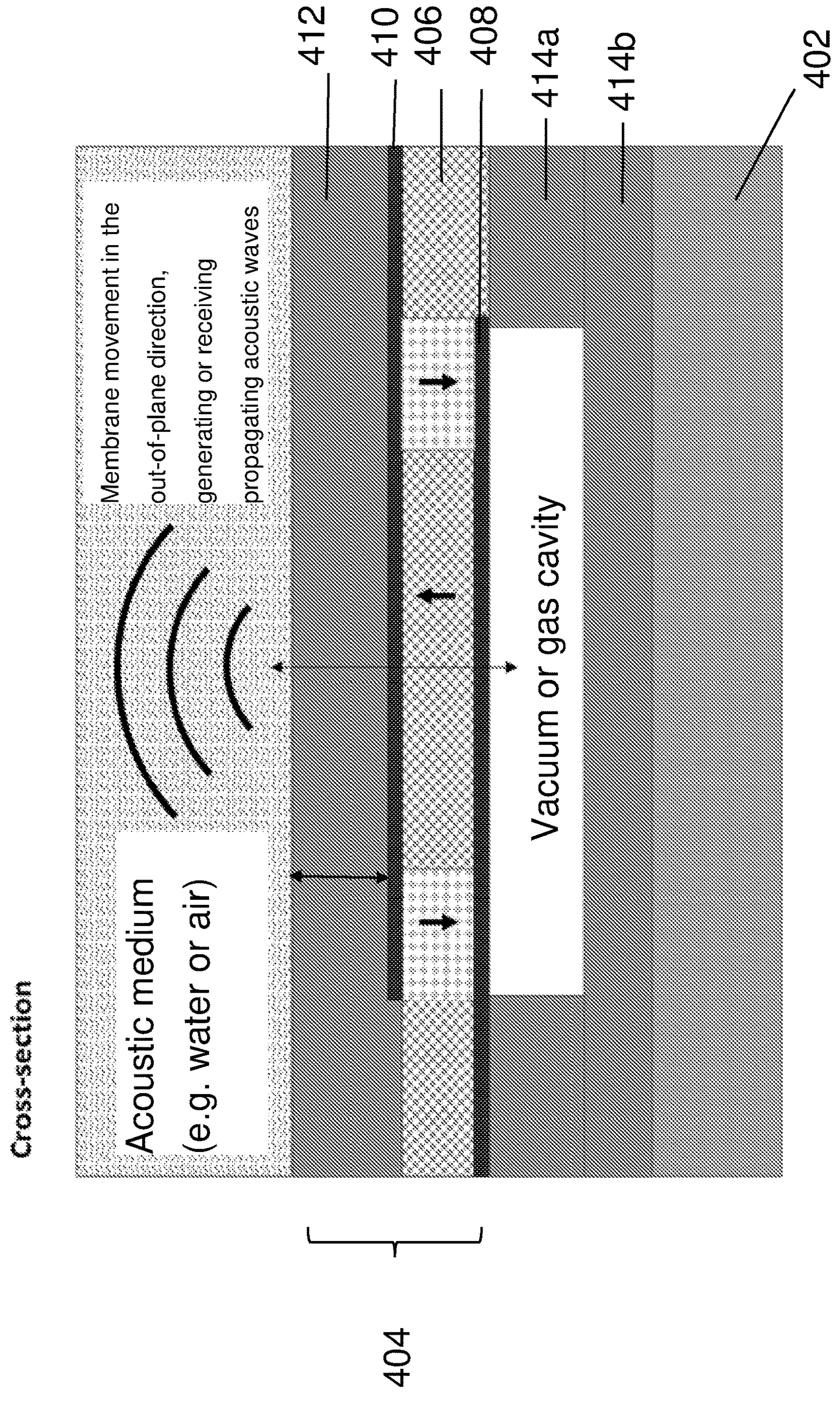
FIG. 4A is a schematic showing a cross-sectional side view of a piezoelectric micromachined ultrasonic transducer (pMUT) according to various embodiments.

FIG. 4A is a schematic showing a cross-sectional side view of a piezoelectric micromachined ultrasonic transducer (pMUT) according to various embodiments. The pMUT shown in FIG. 4A may be a piezoelectric device including a substrate 402, and a layered stacked arrangement 404 anchored to the substrate 402. The layered stacked arrangement 404 may include a membrane including a piezoelectric/ferroelectric layer 406 that deflects in the out-of-plane direction to mechanically couple to the acoustic medium for acoustic waves. The piezoelectric/ferroelectric layer 406 may include a material such as ScAlN or PZT. The layered stacked arrangement 404 or membrane may also include a first electrode 408 on a first side of the piezoelectric/ferroelectric layer 406, and a second electrode 410 on a second side of the piezoelectric/ferroelectric layer 406 opposite the first side. The layered stacked arrangement or membrane may also include a further layer 412 such that the second electrode 410 is between the piezoelectric/ferroelectric layer 406 and the further layer. The further layer 412 may be a non-piezoelectric elastic layer. The further layer 412 may include a dielectric material such as silicon dioxide or silicon nitride, a semiconductor material such as silicon (Si), or an electrically conductive material such as aluminium (Al). The piezoelectric/ferroelectric layer 406 may have inverted poling regions/domains.

The acoustic medium may include air, water, body tissue, or one or more intermediate or protective layers (such as gels or polymers) that couple the acoustic waves.

The pMUT may also include dielectric layers 414*a*, 414*b* anchoring the layered stacked arrangement 404 to the substrate 402. The substrate 402 may, for instance, be a silicon wafer for wafer-scale fabrication. The device may include a cavity underneath (which may be vacuum or gas-filled, and may be sealed or vented) the membrane.

As mentioned above, the membrane may include at least one piezoelectric layer, i.e. layer 506, for transduction, with electrodes 408, 410 placed above and below the piezoelectric layer. An elastic layer (i.e. layer 412 as shown) or second piezoelectric layer can be used in conjunction with an applied voltage across the piezoelectric layer(s) to generate the deflection of the membrane in the out-of-plane direction. The device may be designed to have a resonant frequency at or close to the frequency of operation, which is typically defined by penetration depth or the resolution required in the medium for ranging or imaging. The resonant frequency may be dependent on the geometry and material properties of the membrane, most significantly the radius, the thickness as well as the elastic modulus and density.

Figure 4B:
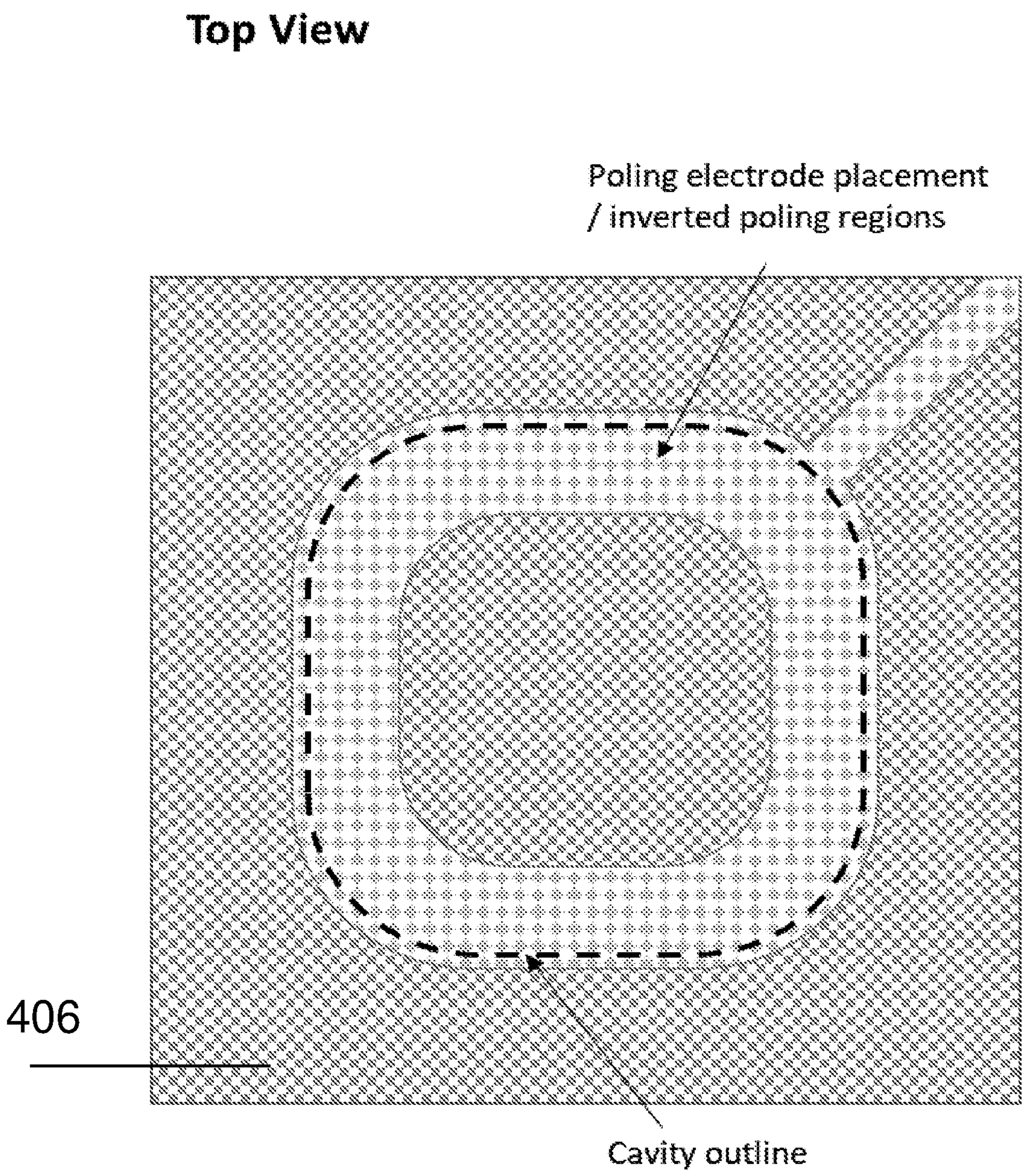
FIG. 4B shows the placement of the poling electrodes on the piezoelectric/ferroelectric layer, as well as an outline of the underlying cavity.
Figure 4C:
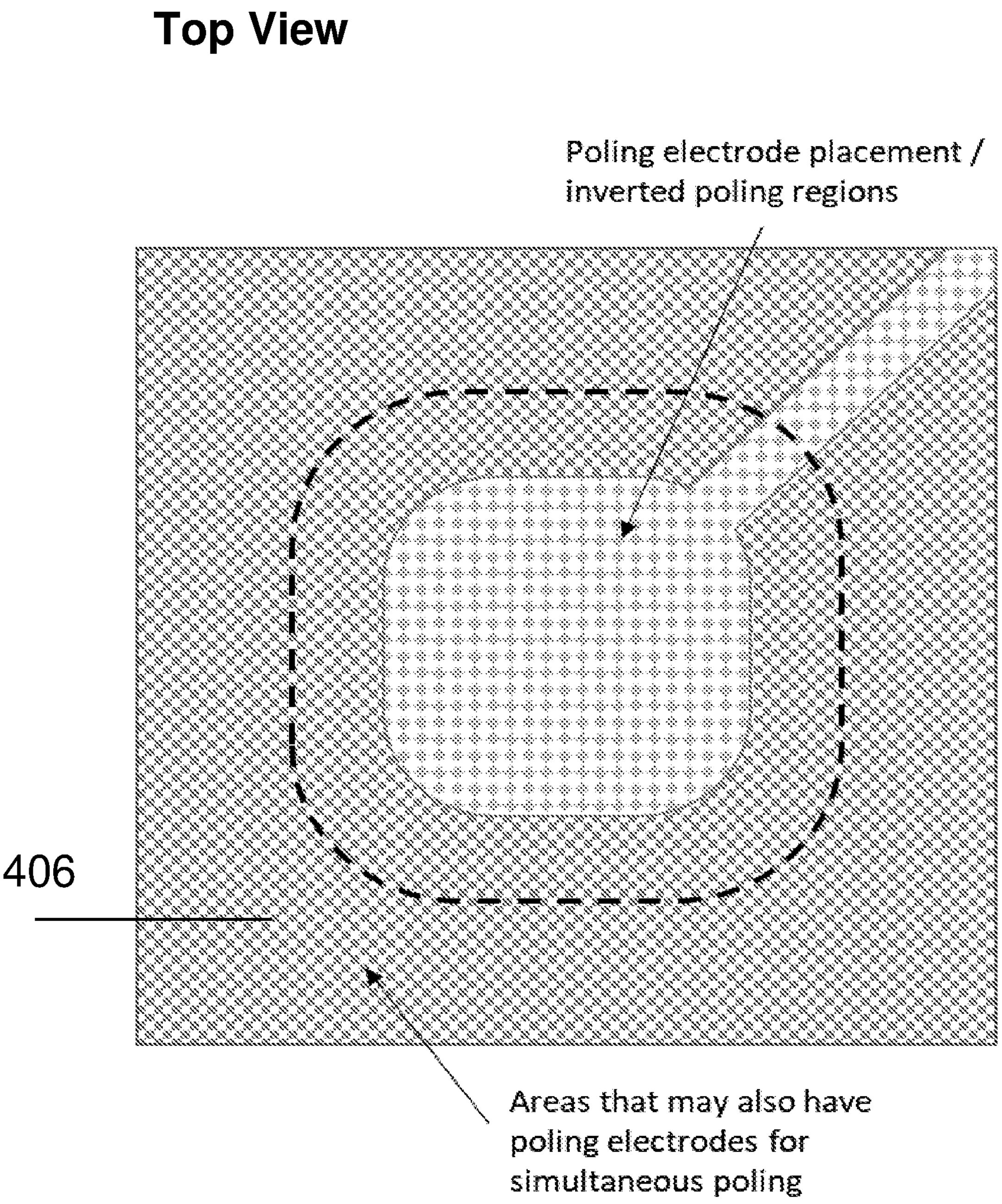
FIG. 4C is a schematic showing a top view of an alternative possible configuration of the piezoelectric/ferroelectric layer shown in FIG. 4A according to various embodiments.

As also mentioned above, the piezoelectric layer 406 may be ferroelectric, with different regions poled in different directions, as shown in FIG. 4A-C. FIG. 4B is a schematic showing a top view of one possible configuration of the piezoelectric/ferroelectric layer 406 shown in FIG. 4A according to various embodiments. FIG. 4B shows the placement of the poling electrodes on the piezoelectric/ferroelectric layer 406, as well as an outline of the underlying cavity. If the ferroelectric material is self-poled as deposited, only the inverted regions may need to be poled, allowing for islands. FIG. 4C is a schematic showing a top view of an alternative possible configuration of the piezoelectric/ferroelectric layer 406 shown in FIG. 4A according to various embodiments. In FIG. 4C, different regions of the piezoelectric/ferroelectric layer 406 may be poled in opposite directions by different poling electrodes.

Figure 4D:
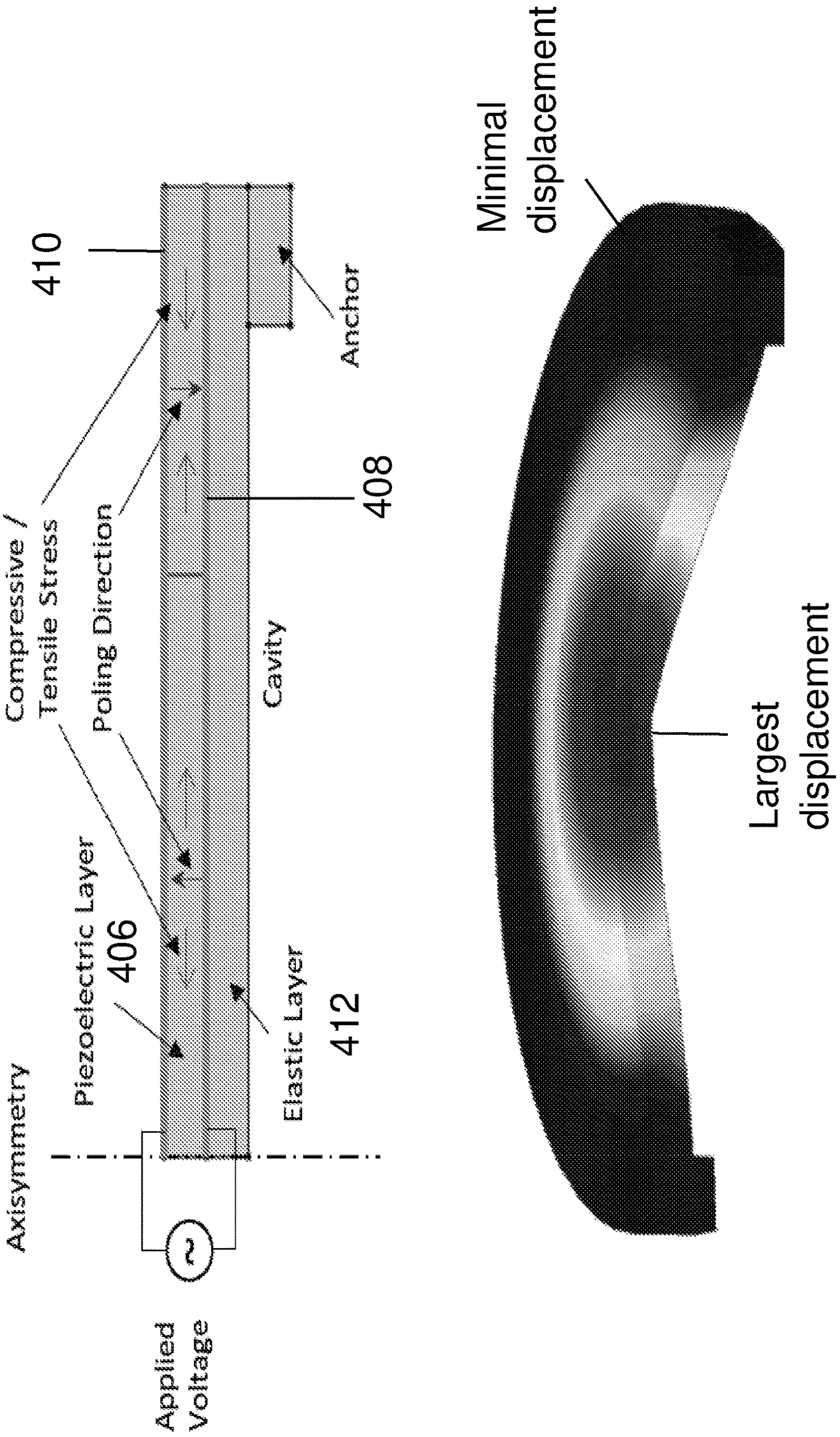
FIG. 4D shows (above) a simplified diagram of the membrane showing the poling of the piezoelectric/ferroelectric layer and the applied voltages to generate a membrane displacement according to various embodiments; and (below) a schematic showing the fundamental vibration mode of the membrane according to various embodiments.

FIG. 4D shows (above) a simplified diagram of the membrane showing the poling of the piezoelectric/ferroelectric layer 406 and the applied voltages to generate a membrane displacement according to various embodiments; and (below) a schematic showing the fundamental vibration mode of the membrane according to various embodiments. The electrodes 408, 410 may be applied with an alternating current (a.c.) voltage to generate the fundamental vibration mode. The centre area of the membrane is the region of largest displacement in the out-of-plane direction, while the outermost region is the region of minimal displacement according to various embodiments.

The piezoelectric/ferroelectric layer 406 may include ScAlN or PZT, with a thickness of a value between 200 nm to 5 μm. The piezoelectric/ferroelectric layer 406 can be deposited via physical vapour deposition (PVD), or by other means such as chemical solution deposition (CSD) techniques. The differently poled regions can be realized on the wafer-scale across multiple devices via the fabrication process flow later. The elastic layer 412 may include a dielectric material such as silicon oxide, silicon nitride, a semiconductor material such as silicon, or a conductive material such as aluminium, with the thickness being a value in the range of 200 nm to 20 μm. The cavity radius may be any value between 10 μm to 2 mm. The resonant frequencies of the pMUT may be in the several tens of kilohertz (kHz) to tens of megahertz (MHz) range.

The regions of inverse poling may be designed to maximize the displacement for a given voltage (for an actuator), or to maximize the receive voltage for a given acoustic pressure (for a sensor). For a pMUT, the poling can be inverted between the centre region and the edge region of the membrane. Electrodes can be placed to pole the ferroelectric layer in the configurations shown (FIGS. 4B-C). In some situations, the ferroelectric material as-deposited (such as ScAlN or PVD PZT) may already be naturally poled, and it may only be necessary to invert the poling of selected regions, with the poling configuration shown in FIG. 4B possible (areas/islands without poling electrodes are possible). In other situations, the ferroelectric material as-deposited may not be poled or may be weakly poled, and the layer may need to be poled in both directions to improve the piezoelectric performance (FIG. 4C).

Figure 5A:
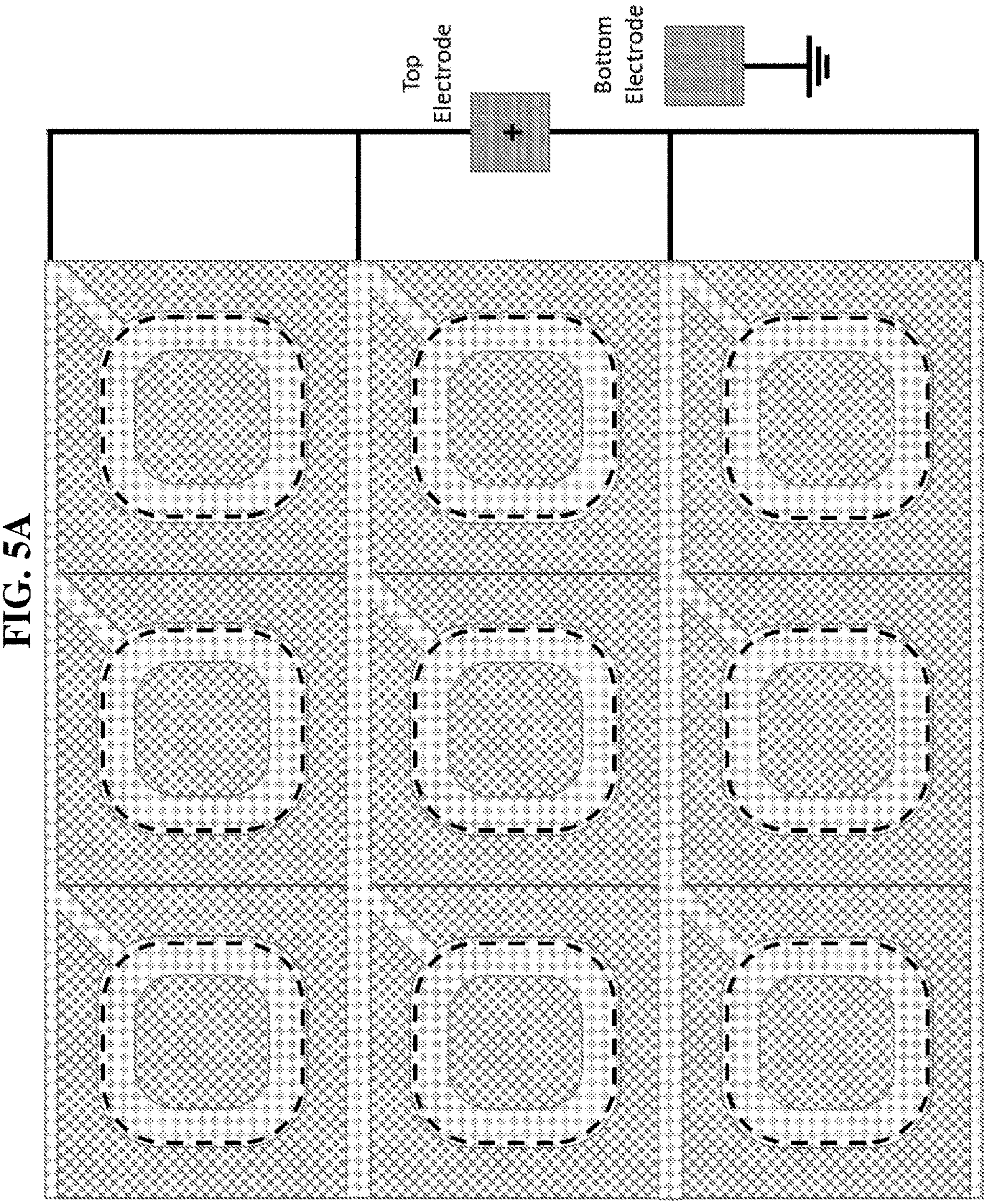
FIG. 5A is a schematic showing the poling of multiple devices at the same time using linked electrodes according to various embodiments.
Figure 5B:
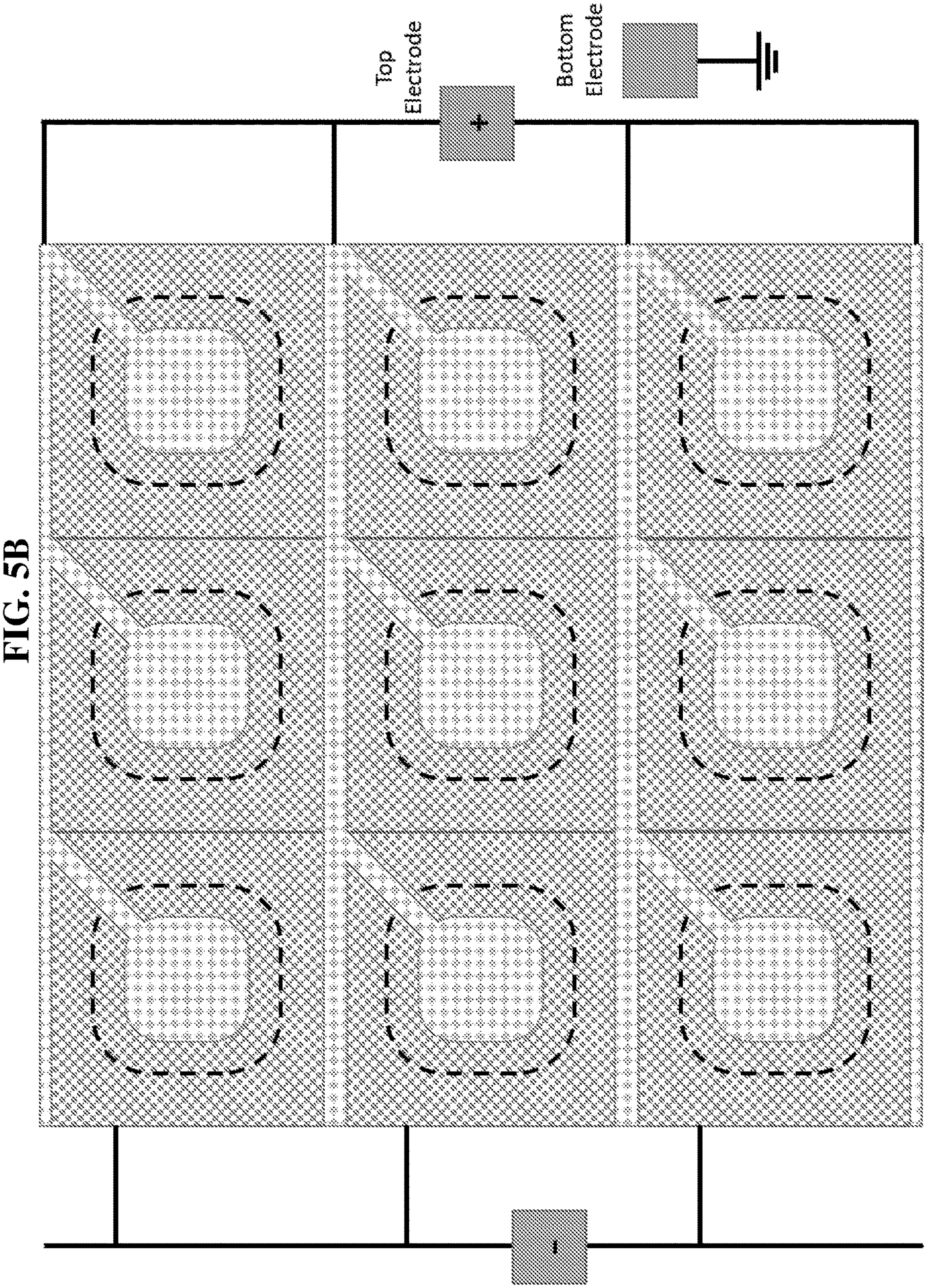
FIG. 5B is a schematic showing the poling of multiple devices with different regions poled in different directions at the same time using linked electrodes according to various embodiments.

The poling can be performed with multiple devices linked together electrically (FIG. 5A), such that numerous individual pMUTs can be poled at once, and even simultaneously in different directions (FIG. 5B), greatly reducing the process time required to fabricate the devices. FIG. 5A is a schematic showing the poling of multiple devices at the same time using linked electrodes according to various embodiments. FIG. 5B is a schematic showing the poling of multiple devices with different regions poled in different directions at the same time using linked electrodes according to various embodiments.

Figure 6:
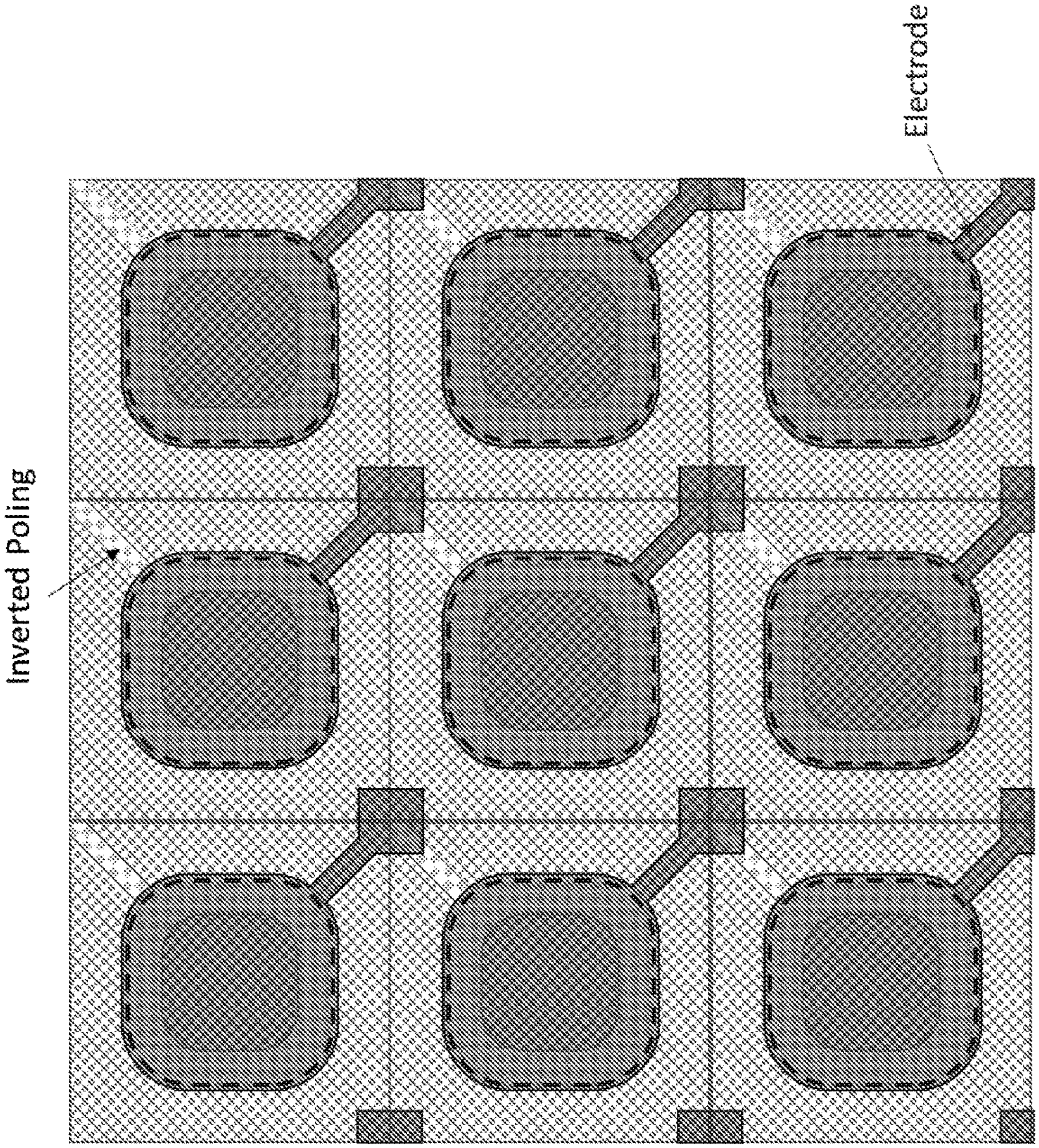
FIG. 6 is a schematic showing the final electrodes with different configuration compared to the poling electrodes according to various embodiments.

In particular, this method of poling can be realized as part of the fabrication process on full wafers before singulation to allow for the easy and highly accurate modification of the electrodes to create a different configuration from that of the poling. An example of this is shown in FIG. 6. FIG. 6 is a schematic showing the final electrodes with different configuration compared to the poling electrodes according to various embodiments. The final electrodes may each be over regions of different polarities. In addition, the final electrodes may also connect to the complementary metal oxide semiconductor (CMOS) circuitry under the pMUT for electrical control of each individual pMUT. FIG. 6 shows that after the poling, the poling electrodes may be modified such that the final electrodes are over and are physically linked to the regions of both polarities, with the final electrode configuration being notably different from the poling electrode configuration. The final electrodes may also be connected to other routing layers, such as those on CMOS wafers, for achieving individual electrical control of each pMUT or groups of pMUTs.

The configuration with domain inversions may (a) increase the actuation/sensing performance by approximately 2× (see FIG. 7), or reduce the required drive voltage accordingly; (b) reduce the number of routing wires required; and/or (c) when dedicated as an acoustic receiver, multiple pMUTs or sections of pMUTs may be electrically arranged in series to boost the signal voltage (with a lower device capacitance), and the poling inversion concept here may reduce or eliminate the need for numerous vias between successive pMUTs, allowing for a larger active receiving area.

Figure 7:
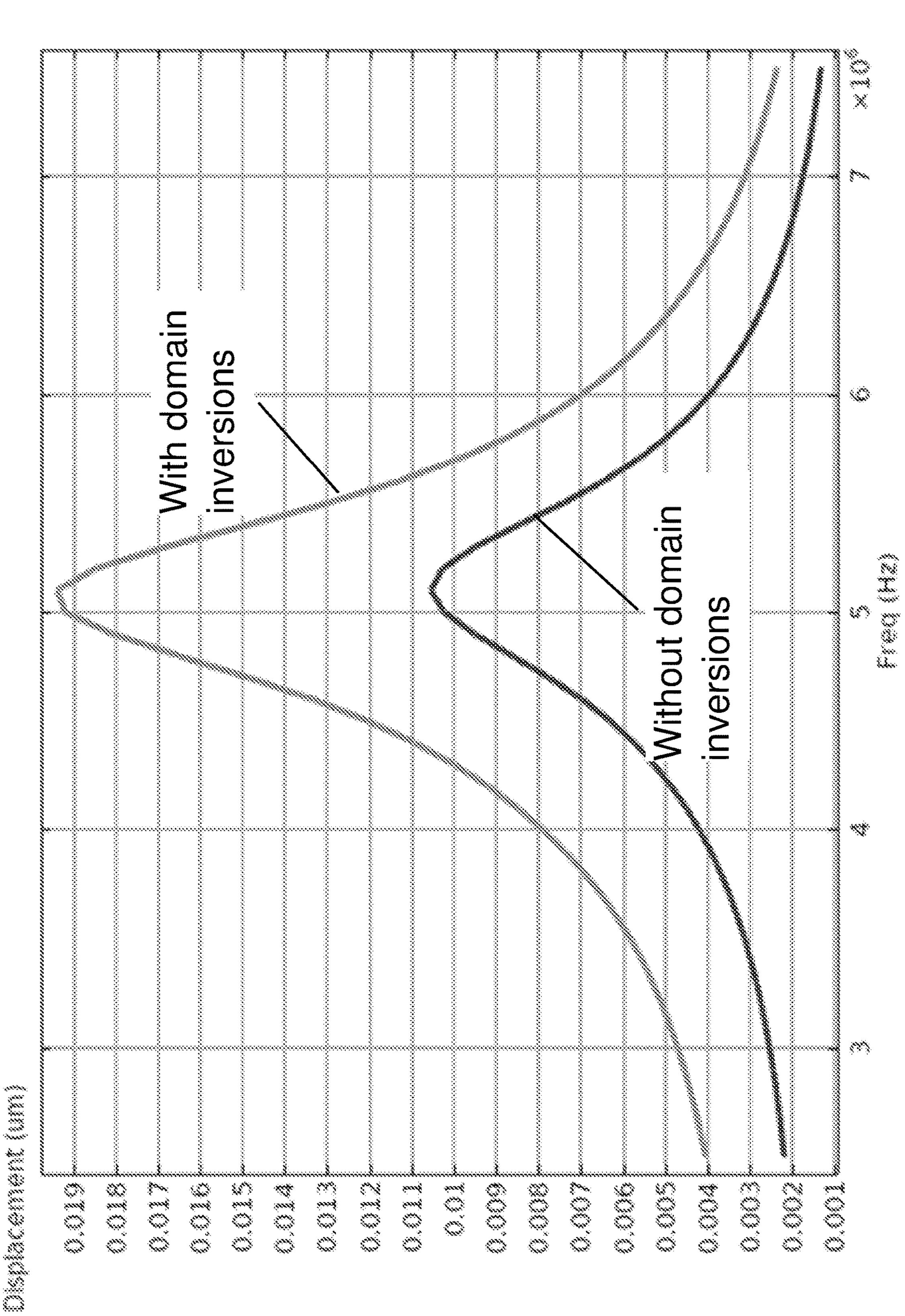
FIG. 7 is a plot of displacement (in micrometres or μm) as a function of frequency (in Hertz or Hz) showing a simulated comparison between a device with poled domain inversions according to various embodiments, and a device without poled domain inversions.

FIG. 7 is a plot of displacement (in micrometres or μm) as a function of frequency (in Hertz or Hz) showing a simulated comparison between a device with poled domain inversions according to various embodiments, and a device without poled domain inversions. An improvement of almost 2 times may be observed for the device with poled domain inversions over the device without poled domain inversions.

The benefits to the routing may be seen especially in configurations where the regions of inverted polarization are in the form of islands that are bounded by regions of the opposite polarity. This poling mechanism may eliminate the need for routing structures and may allow for maintaining high performance especially when the structures are scaled down in dimension.

FIGS. 8A-H show the fabrication of a plurality of piezoelectric devices according to various embodiments. The piezoelectric devices may be pMUTs. Instead of poling each device individually, a whole wafer including numerous devices may be poled at once.

Figure 8A:
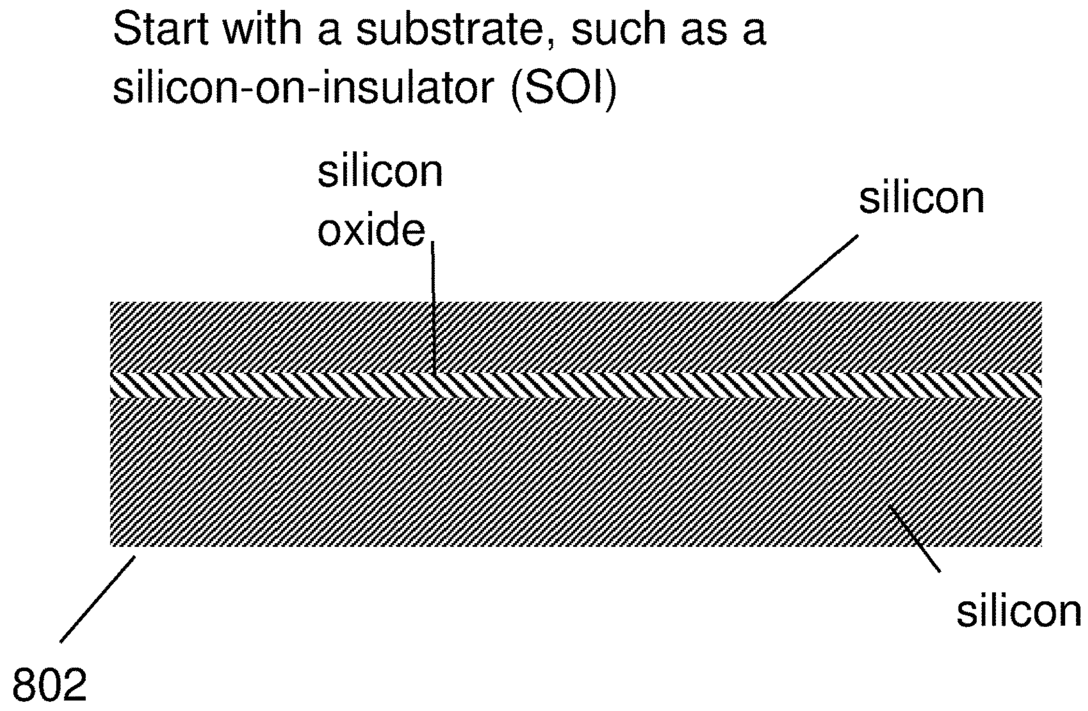
FIG. 8A is a schematic showing a substrate according to various embodiments.

FIG. 8A is a schematic showing a substrate 802 according to various embodiments. The fabrication process for a pMUT may begin with a substrate 802 such as a silicon-on-insulator (SOI) wafer, which has a silicon device layer (e.g. between 200 nm to 20 μm) on a layer of silicon oxide. The silicon device layer may be used to define the elastic layer of the membrane with good thickness control, with the silicon oxide layer beneath.

Figure 8B:
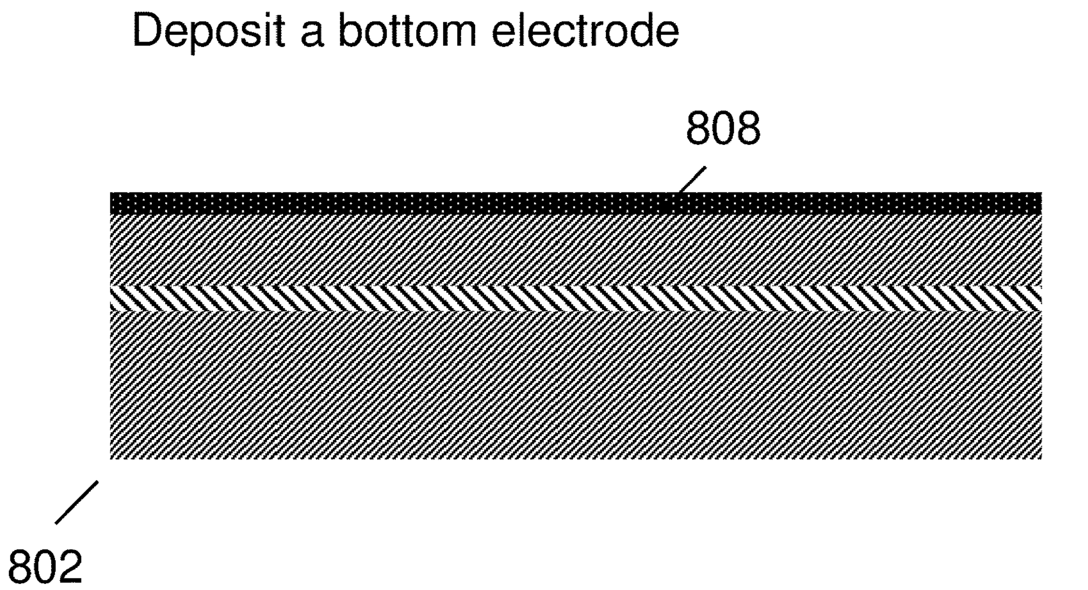
FIG. 8B is a schematic showing forming a bottom electrode on the substrate according to various embodiments.

FIG. 8B is a schematic showing forming a bottom electrode 808 on the substrate 802 according to various embodiments. A metal such as platinum (Pt), molybdenum (Mo), gold (Au), or aluminium (Al) may be deposited to form the bottom electrode 808, i.e. the first electrode. An alternative may be to dope the surface of the silicon with a dopant, such as boron or phosphorus, so as to form a highly conductive surface that serves the bottom electrode 808.

Figure 8C:
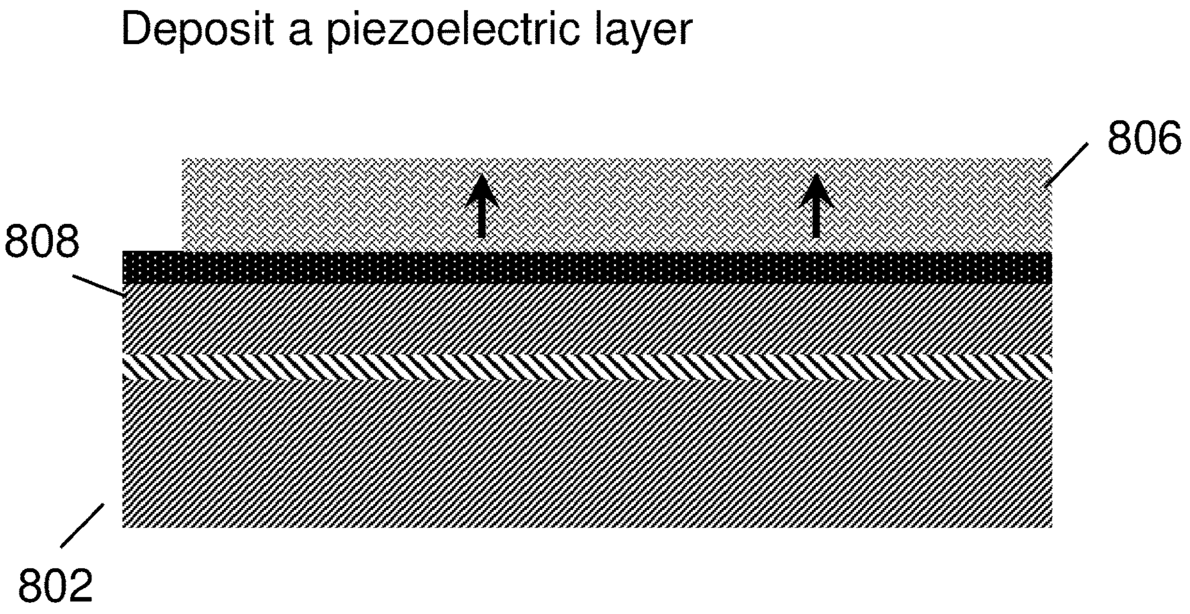
FIG. 8C is a schematic showing forming a piezoelectric layer, i.e. a ferroelectric layer according to various embodiments.

FIG. 8C is a schematic showing forming a piezoelectric layer, i.e. a ferroelectric layer 806 according to various embodiments. The ferroelectric layer 806 may be deposited via physical vapour deposition (PVD) or chemical solution deposition (CSD) techniques. A region may be masked such that the bottom electrode 808 may be left exposed for electrical contact to the bottom electrode 808. For example, the shadow mask may be implemented at the edge of the wafer to prevent deposition onto the bottom electrode 808, thus eliminating the need for another etch step.

Figure 8D:
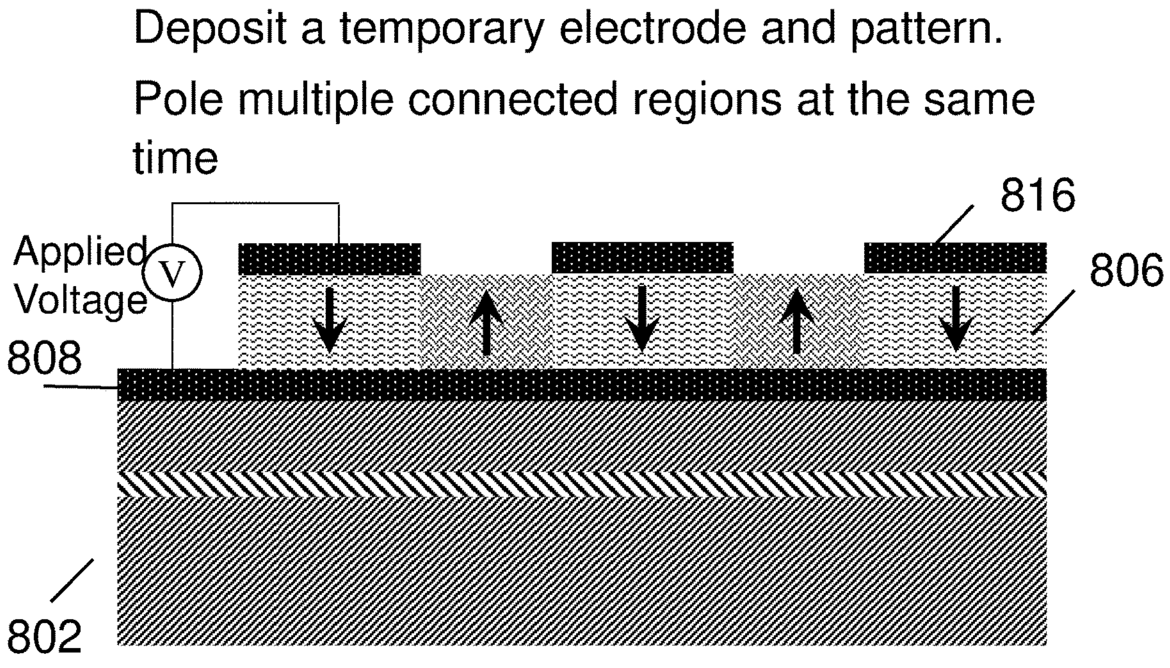
FIG. 8D is a schematic showing forming poling electrodes according to various embodiments.

FIG. 8D is a schematic showing forming poling electrodes 816 according to various embodiments. Electrode material may be deposited and patterned to form the poling electrodes 816 based on the desired poling directions at different regions of the ferroelectric layer 806. The poling electrodes 816 may be of a similar material as that of the bottom electrode 808. The ferroelectric layer 806 may be naturally poled as deposited, only necessitating poling electrodes 806 to invert the selected regions. However, if the ferroelectric layer 806 is weakly poled as deposited, multiple separate electrodes may be defined to pole the different regions in different directions as desired. For poling, a strong electric field is applied in the corresponding direction across the desired region(s) of the ferroelectric layer 806 using the applied voltages across the electrodes 816, 808. Heat may be applied simultaneously. Numerous devices on a wafer may be poled at once using electrical probes. After poling, the wafer can continue the fabrication process, and the temporary poling electrodes 816 may be removed or otherwise modified, and a new final electrode geometry may be defined. However, the polarity of the ferroelectric layer 806 may be still maintained in the direction as poled.

Figure 8E:
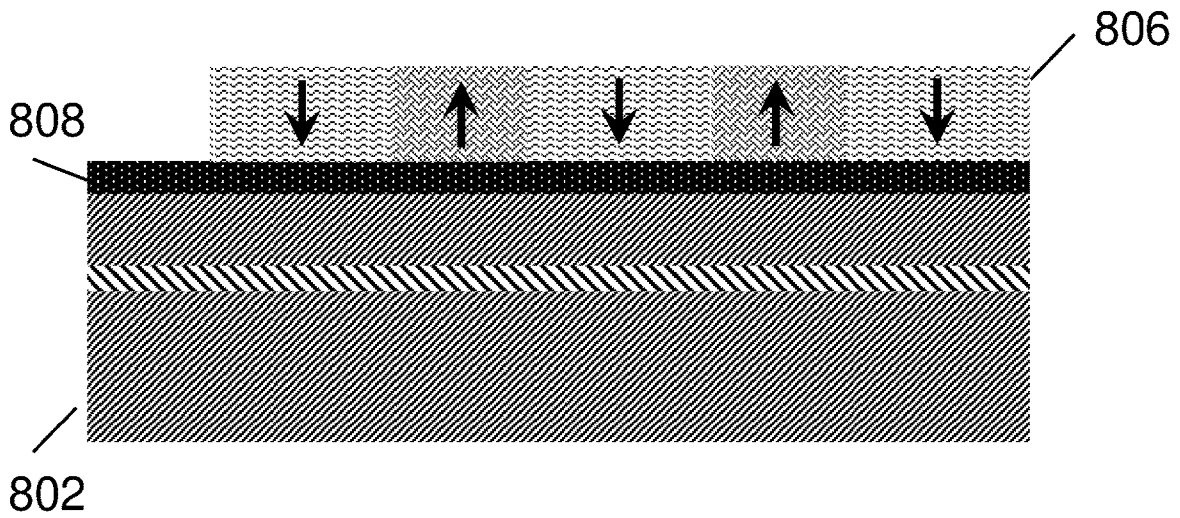
FIG. 8E is a schematic showing the removal of the poling electrodes according to various embodiments.

FIG. 8E is a schematic showing the removal of the poling electrodes 816 according to various embodiments. After poling, care must be taken to prevent the depolarization of the ferroelectric layer 806. Depolarized can occur due to electric fields, mechanical stresses, or heat. During microfabrication processing steps such as reactive ion etching, high electric fields or temperatures may be applied that can depolarize the ferroelectric. Maintaining the polarization may be critical after poling, and may be achieved by limiting the process conditions during the subsequent processes. An option to avoid depolarization may be to use a metal such as molybdenum (Mo), which can be etched by xenon difluoride ($XeF_2$) isotropically in mild conditions, while having an excellent etch selectivity to piezoelectric materials and masking photoresists. Alternatively, scandium aluminium nitride ($Sc_xAl_{1-x}N$) or other ferroelectric wurzite-type materials with higher coercive fields may be used to form the ferroelectric layer 806 to reduce the possibility of depolarization.

Figure 8F:
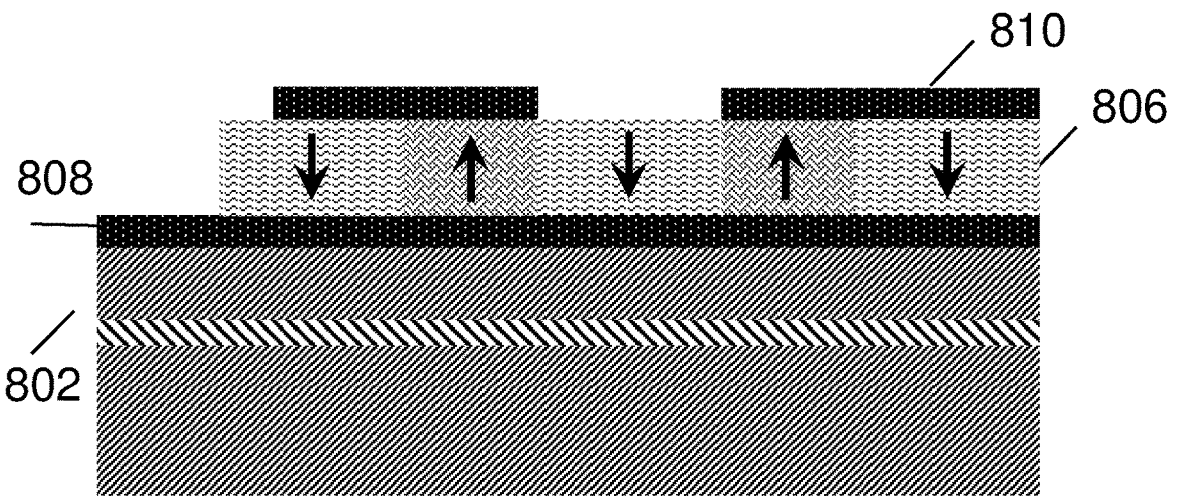
FIG. 8F is a schematic showing the forming of the final top electrodes according to various embodiments.

FIG. 8F is a schematic showing the forming of the final top electrodes 810 according to various embodiments. The final top electrodes 810, i.e. the second electrodes, may be of a different configuration or geometry from that of the temporary poling electrodes 816.

Figure 8G:
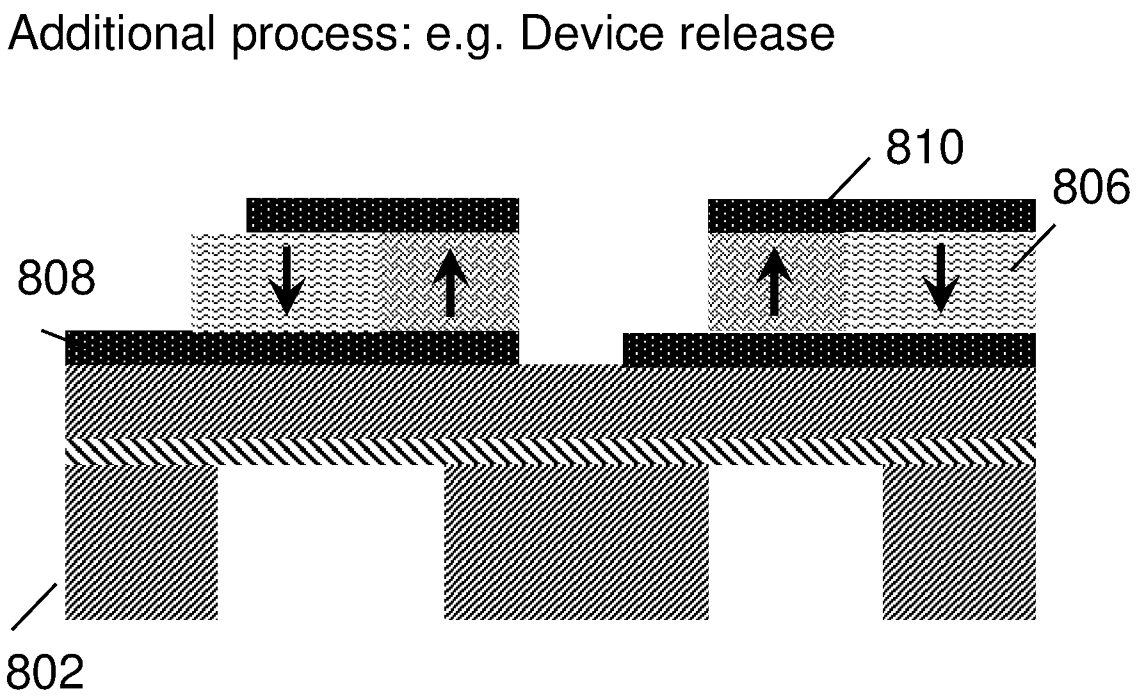
FIG. 8G is a schematic showing additional fabrication processes according to various embodiments.

FIG. 8G is a schematic showing additional fabrication processes according to various embodiments. The membrane may be released from the substrate 802 to allow for pMUT deflection. This may be achieved by etching a hole through the substrate 802 from the back, stopping at the silicon oxide layer. Alternatively, the method may involve defining vent holes and using vapour hydrogen fluoride (HF) to selectively etch away the silicon oxide beneath the device silicon layer of the SOI wafer. Other possible ways of forming cavities may also be used in place of starting with the SOI wafer. These alternative ways may include, for instance, using $XeF_2$ to etch a cavity in silicon, starting with a cavity SOI substrate with predefined cavities by bonding a second wafer over an etched cavity, or by annealing etched holes in silicon to form sealed cavities. Other layers may also be defined to allow for electrical routing or wire bonding, for passivation, or to seal the vent holes. Another possibility may be to start with a CMOS wafer, and define the electrical routing from the pMUT into the CMOS wafer.

Figure 8H:
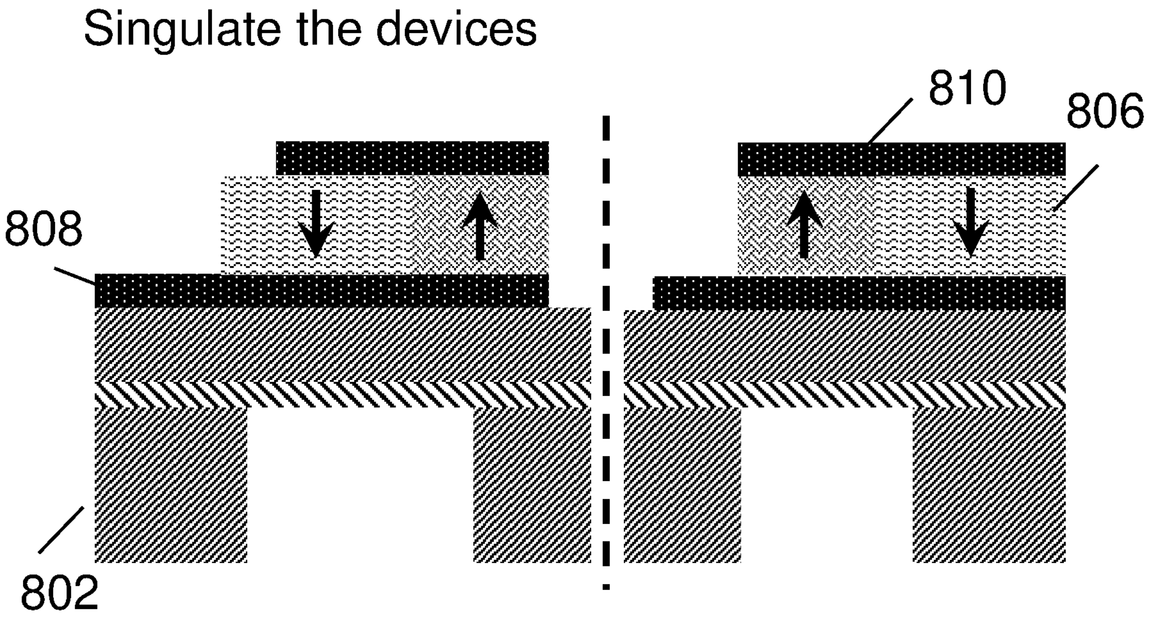
FIG. 8H is a schematic showing the singulation into the plurality of piezoelectric devices according to various embodiments.

FIG. 8H is a schematic showing the singulation into the plurality of piezoelectric devices according to various embodiments. These devices as fabricated in the batch configuration may be separated into individual pMUTs or groups of pMUTs by dicing (e.g. saw dicing, stealth laser dicing, or plasma dicing). These devices may no longer need to be individually poled post-process, which may be difficult to achieve otherwise (e.g. requiring a long period of high temperature and high electric fields; or would require many probes for poling individually addressable pMUTs in an array; or may be routed to CMOS circuitry directory, thereby potentially contributing to huge cost savings for production.

In order to aid with the poling in different directions in the fabrication method illustrated by FIGS. 8A-H, a gap containing air or a material with a lower dielectric constant (low-k) may be formed in between the different regions of the ferroelectric layer 806. This may allow for better isolation of the electric fields between the regions of different polarization directions, and may enable better control during the poling step, as well as during device operation. This improved isolation may result in better alignment of the dipole domains and higher performance devices.

Figure 9A:
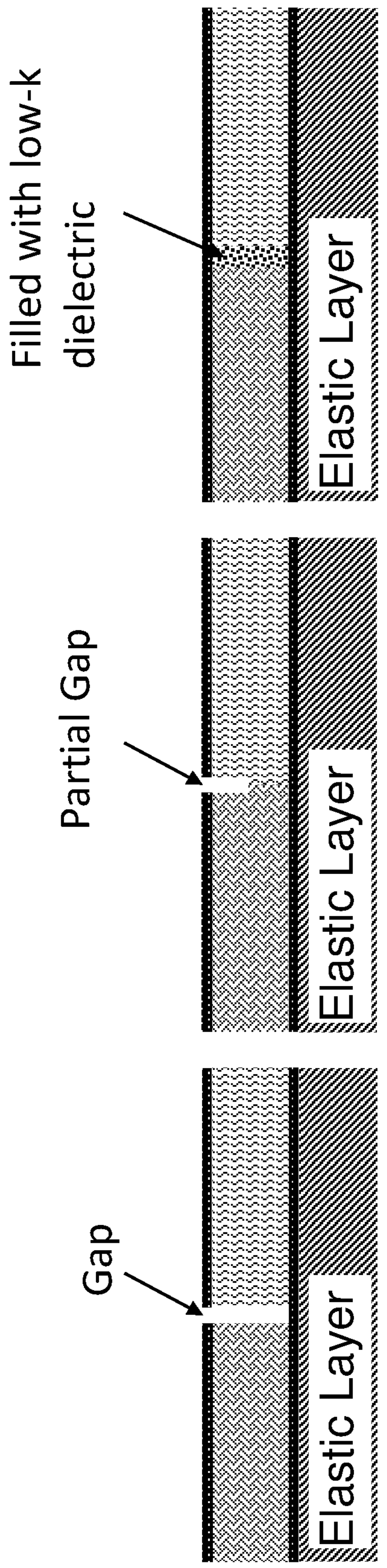
FIG. 9A is a schematic showing (left) domains of different polarization directions in the piezoelectric layer are separated by an air gap according to various embodiments; (middle) domains of different polarization directions in the piezoelectric layer are separated by a partial air gap according to various embodiments; and (right) domains of different polarization directions in the piezoelectric layer are separated by a gap filled with low dielectric constant material according to various embodiments.

FIG. 9A is a schematic showing (left) domains of different polarization directions in the piezoelectric layer are separated by an air gap according to various embodiments; (middle) domains of different polarization directions in the piezoelectric layer are separated by a partial air gap according to various embodiments; and (right) domains of different polarization directions in the piezoelectric layer are separated by a gap filled with low dielectric constant material according to various embodiments.

Figure 9B:
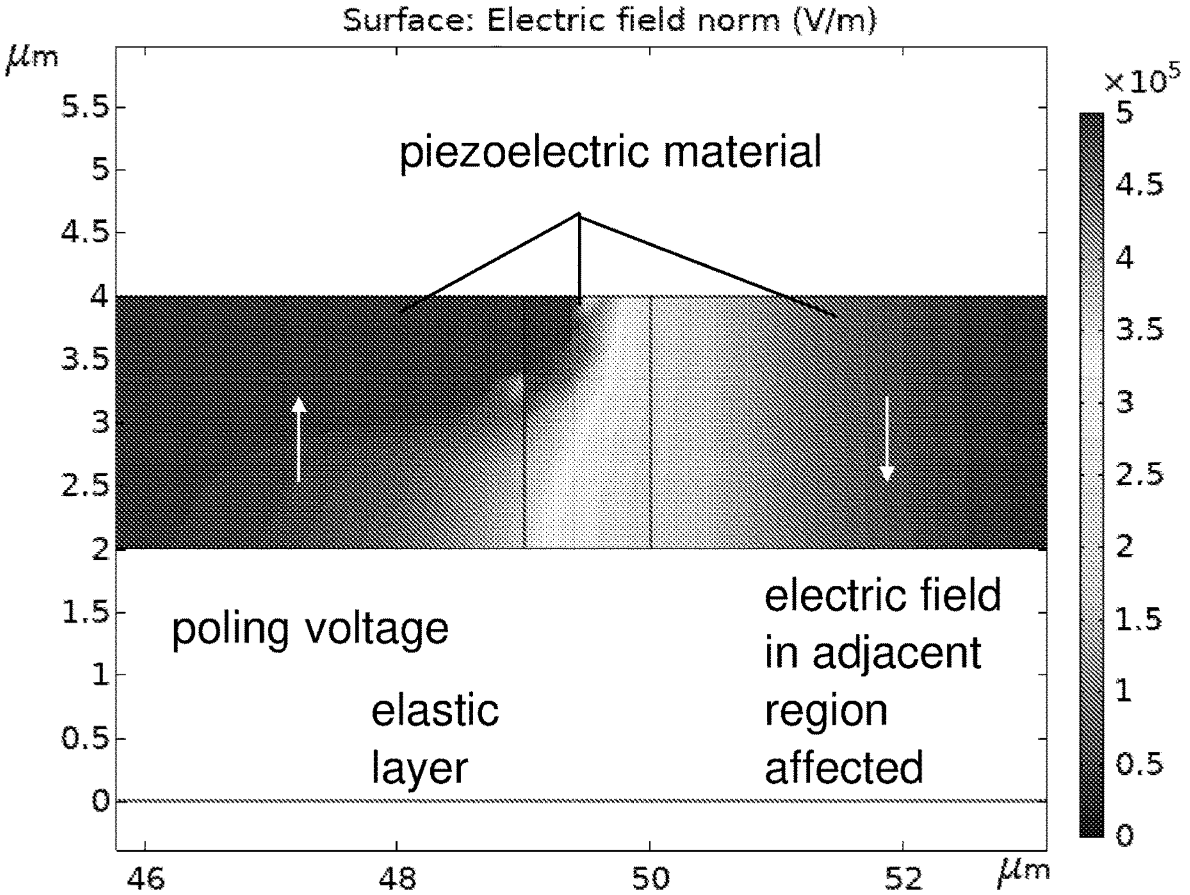
FIG. 9B is an electric field plot of dimensions along the y-direction (in micrometres or μm) as a function of dimensions along the x-direction (in micrometres or μm) showing the variation of electric fields in different regions of a continuous piezoelectric layer when a poling voltage is applied to one of the regions according to various embodiments.
Figure 9C:
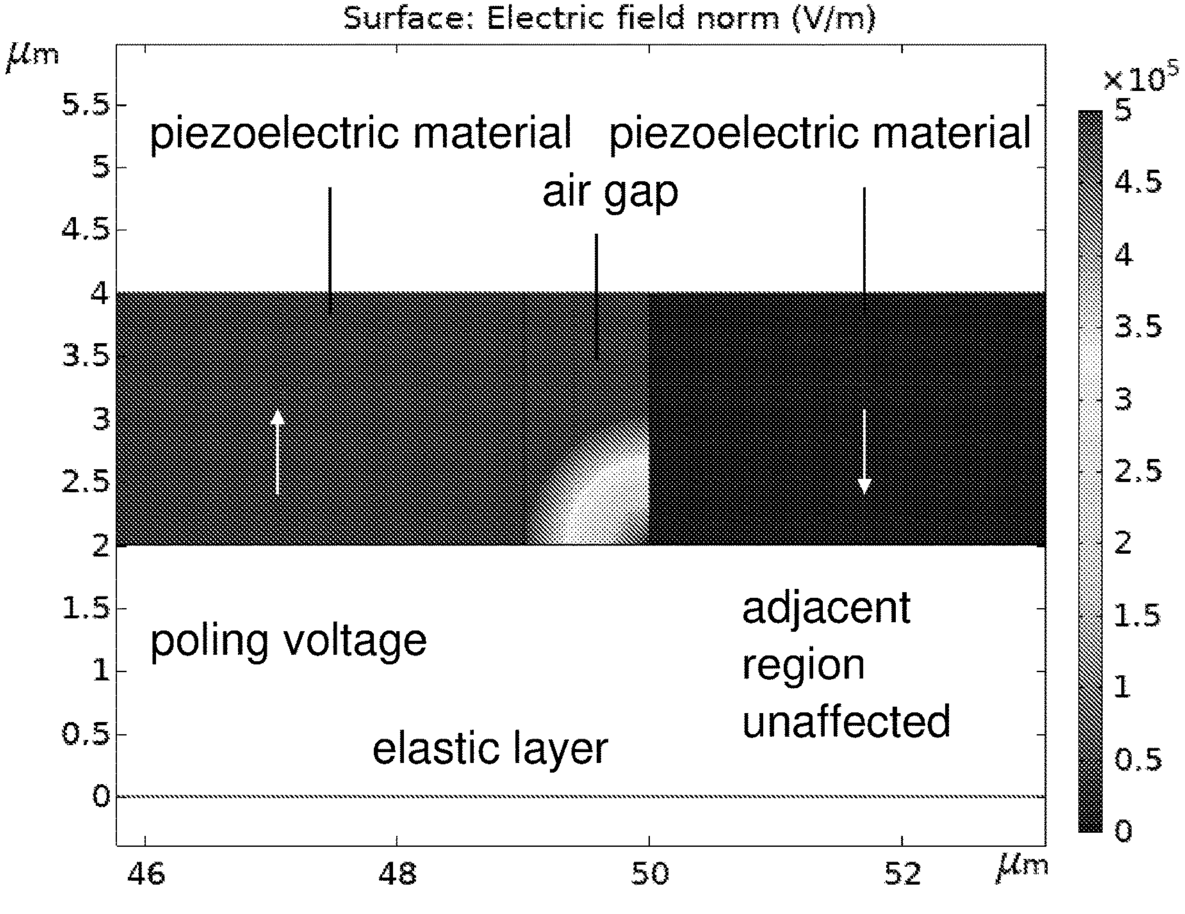
FIG. 9C is an electric field plot of dimensions along the y-direction (in micrometres or μm) as a function of dimensions along the x-direction (in micrometres or μm) showing the variation of electric fields in different regions of a piezoelectric layer separated by an air gap when a poling voltage is applied to one of the regions according to various embodiments.

FIG. 9B is an electric field plot of dimensions along the y-direction (in micrometres or μm) as a function of dimensions along the x-direction (in micrometres or μm) showing the variation of electric fields in different regions of a continuous piezoelectric layer when a poling voltage is applied to one of the regions according to various embodiments. FIG. 9C is an electric field plot of dimensions along the y-direction (in micrometres or μm) as a function of dimensions along the x-direction (in micrometres or μm) showing the variation of electric fields in different regions of a piezoelectric layer separated by an air gap when a poling voltage is applied to one of the regions according to various embodiments. FIG. 9B-C show that the presence of an air gap may provide improved isolation as the electric field in the adjacent region is unaffected by the poling.

Piezoelectric Actuators and Sensors

Piezoelectric actuators are conventionally poled in one direction. In such an actuator, two sets of electrodes are used to create an in-plane bending movement with electrodes of opposing polarities on each side. This uses the transverse effect as described above where voltages applied in the out-of-plane direction cause a lateral contraction on one side and an expansion on the other. Such structures will thus have a lateral bending movement. Conversely, if a force (such as from a proof mass) is applied to the beam for sensor applications, a voltage can be generated across the two sets of electrodes—this is useful for in-plane accelerometers and gyroscopes.

Figure 10A:
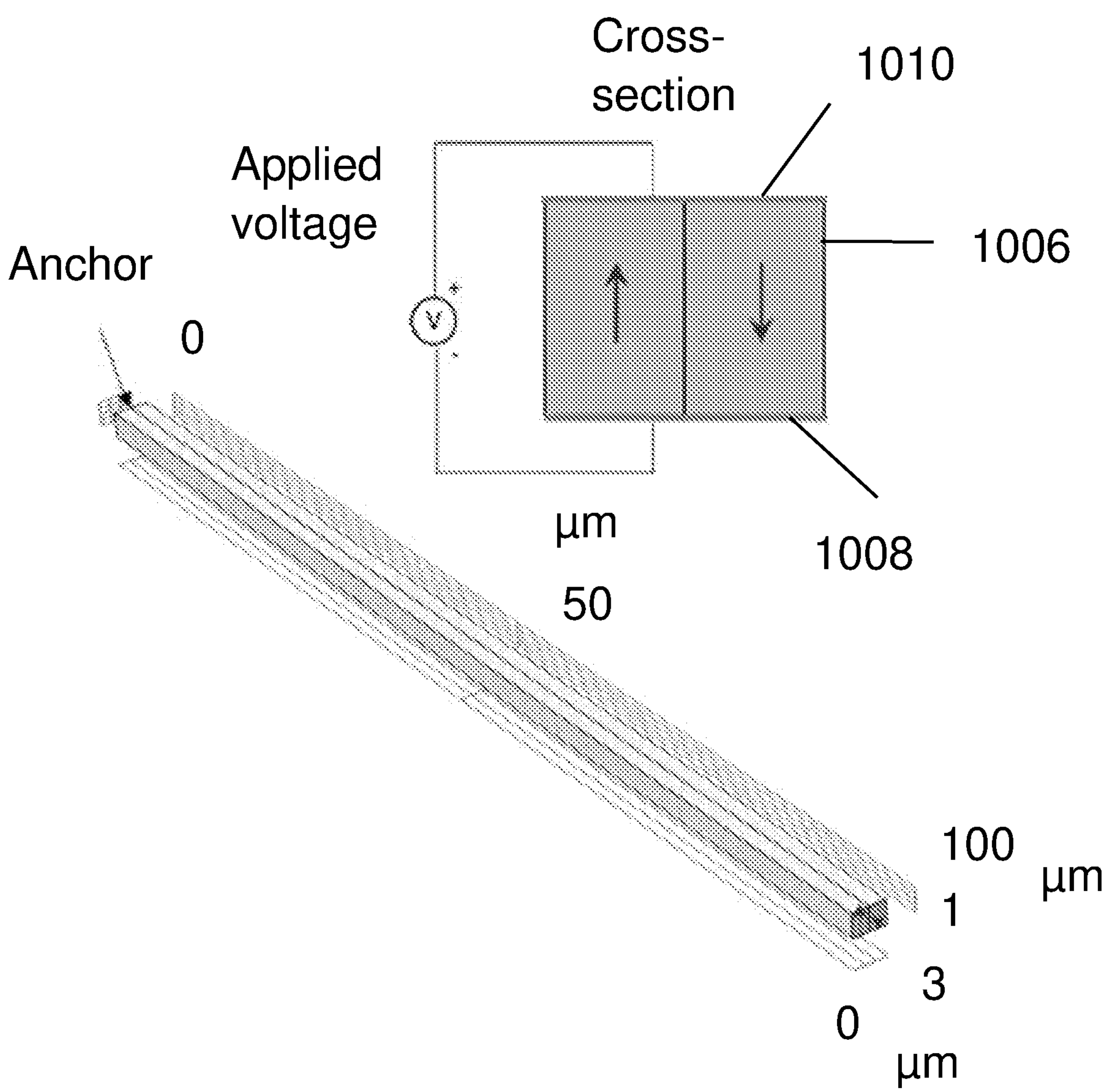
FIG. 10A shows (above) a cross-sectional view and (below) a perspective view of a piezoelectric device, i.e. a lateral bimorph, with inverse domains in the piezoelectric layer and having only one pair of electrodes according to various embodiments.

Instead of using two pairs of electrodes, a piezoelectric device of similar performance may be achieved with just one pair of electrodes by poling the ferroelectric layer. FIG. 10A shows (above) a cross-sectional view and (below) a perspective view of a piezoelectric device, i.e. a lateral bimorph, with inverse domains in the piezoelectric layer and having only one pair of electrodes according to various embodiments. The piezoelectric device may include a piezoelectric layer 1006, as well as a single pair of electrodes including first electrode 1008 and second electrode 1010 on opposing sides of the piezoelectric layer 1006.

Figure 10B:
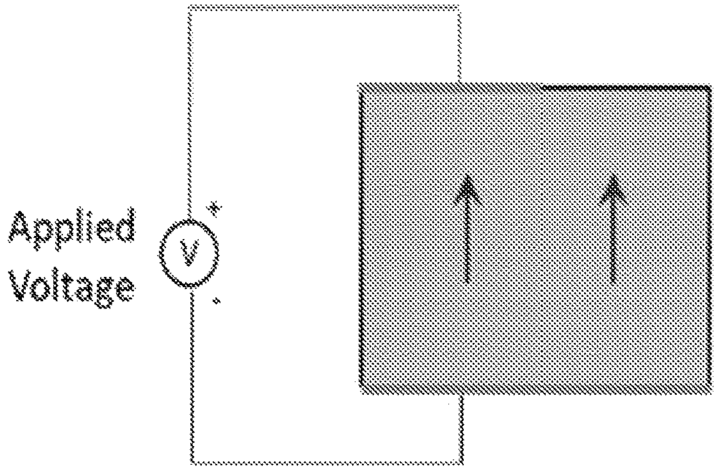
FIG. 10B shows (above) a cross-sectional view and (below) a perspective view of a unimorph structure upon application of a voltage.
Figure 10B:
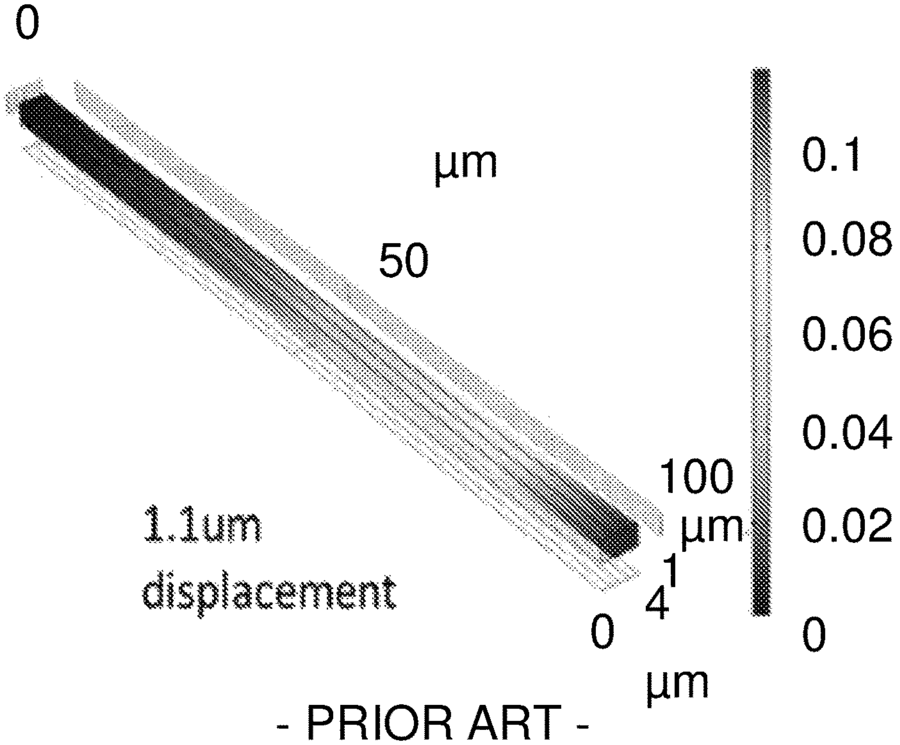
Figure 10C:
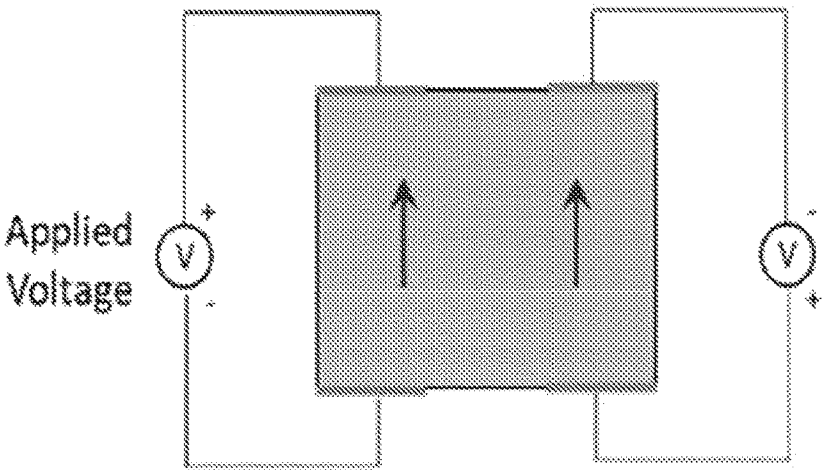
FIG. 10C shows (above) a cross-sectional view and (below) a perspective view of a bimorph structure upon application of a voltage.
Figure 10C:
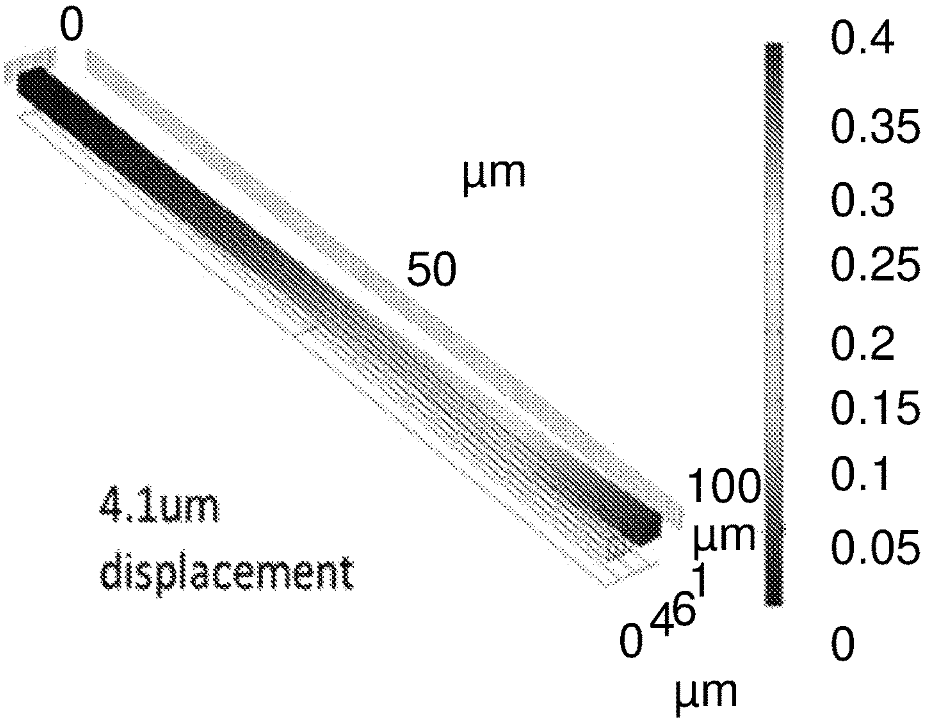
Figure 10D:
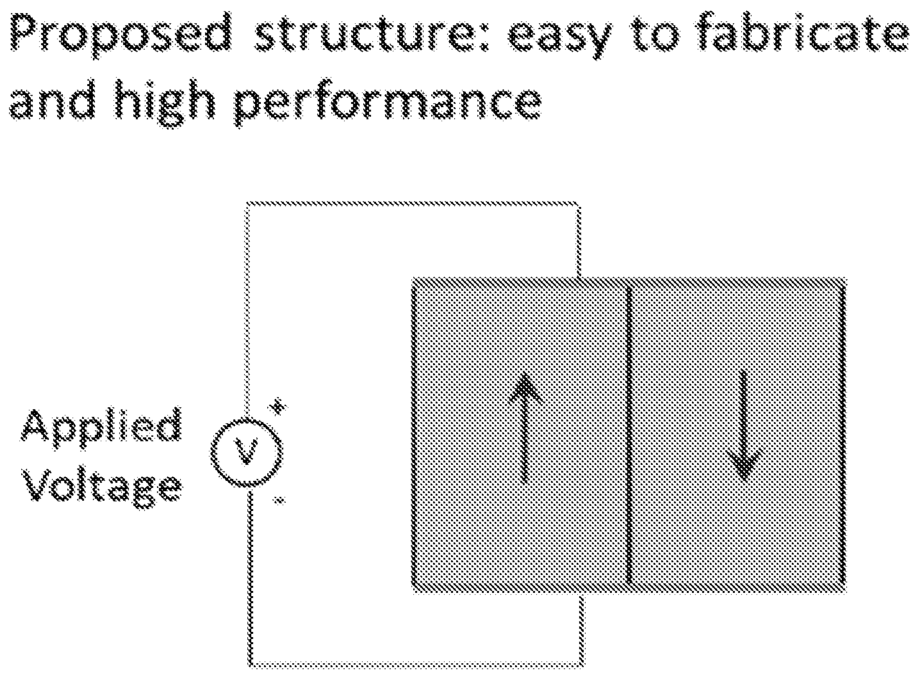
FIG. 10D shows (above) a cross-sectional view and (below) a perspective view of the piezoelectric device shown in FIG. 12A upon application of voltage.
Figure 10D:
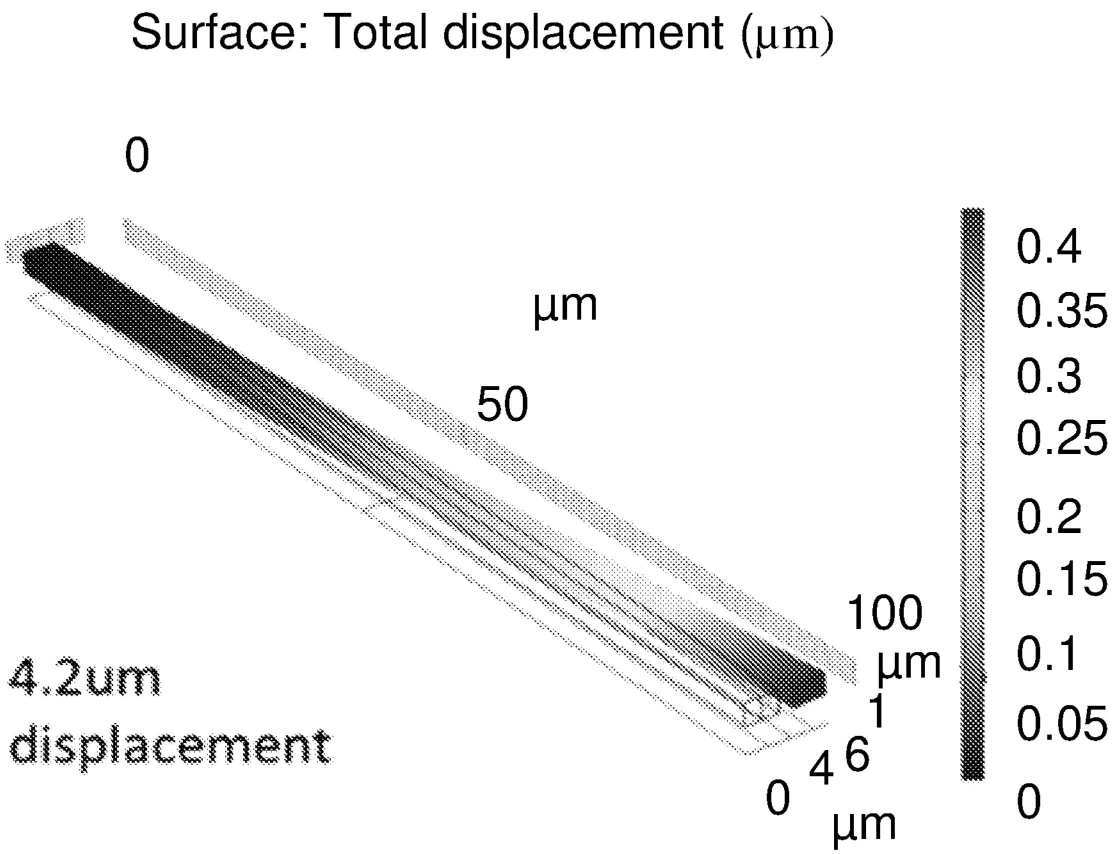

FIG. 10B shows (above) a cross-sectional view and (below) a perspective view of a unimorph structure upon application of a voltage. FIG. 10C shows (above) a cross-sectional view and (below) a perspective view of a bimorph structure upon application of a voltage. FIG. 10D shows (above) a cross-sectional view and (below) a perspective view of the piezoelectric device shown in FIG. 10A upon application of voltage.

One advantage of the device shown in FIG. 10A may be that a larger bending displacement for an actuator, or a higher sensitivity for a sensor may be achieved as compared to the case where the electrodes on one side of the piezoelectric are limited to a common voltage (as can be difficult to pattern in the fabrication process) (FIG. 10A). This can be a significant advantage as higher voltage circuitry typically compromises on power consumption, circuit area, or performance. Another advantage may be that the electrical routing and device fabrication complexity may be reduced significantly, compared to the case where electrodes on both sides are patterned (FIG. 10B). Instead of needing to pattern the electrode on both sides of the piezoelectric and routing the connections from the top to bottom electrodes, the fabrication here only requires one side to be patterned for poling. This may be critical where patterning the electrode before deposition of the piezoelectric could lead to increased defects. Additionally, with the reduced routing requirements, a larger active area is possible. A further advantage is that lithographic patterning requirements can also be relaxed. The electrodes required for such a structure may typically be very narrow. The proposed poling described herein may be achieved with larger feature sizes (extending into the etched area), and the feature size of the final electrodes themselves are larger than in the conventional devices.

Figure 11:
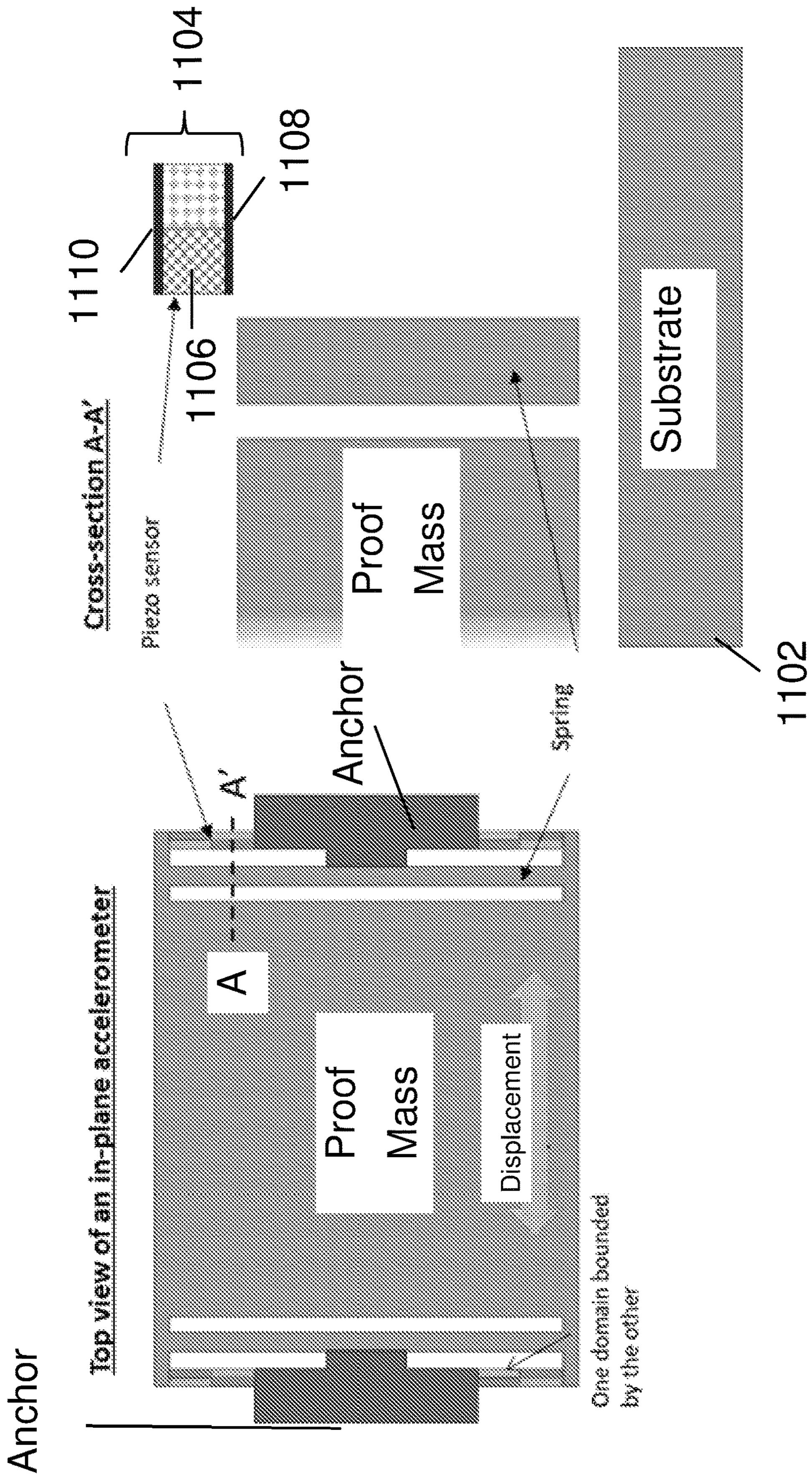
FIG. 11 shows a top view and cross-sectional side view of an in-plane piezoelectric microelectromechanical systems (MEMS) accelerometer according to various embodiments.

FIG. 11 shows a top view and cross-sectional side view of an in-plane piezoelectric microelectromechanical systems (MEMS) accelerometer according to various embodiments. Piezoelectric accelerometers may have certain advantages over capacitive MEMS accelerometers, such as consuming very little power as voltage signals are directly generated from the applied vibration signal; may not require large bias voltages for readout; and may have sufficiently large signals that may not need further amplification. However, they cannot directly measure static acceleration forces, and may be suited for Internet of Things (IoT) purposes to detect vibrations with very low power. The accelerometer proposed herein may be designed to sense vibrations in an in-plane direction, and may include a proof mass, springs, as well as a piezo sensor (i.e. layered stacked arrangement 1104) designed with the inverted domains over a substrate 1102. The domain inversion may reduce the routing complexity significantly, without requiring via holes or connections. The piezo sensor 1104 may include a piezoelectric layer 1106, as well as a first electrode 1108 and a second electrode 1108 on opposite sides of the piezoelectric layer 1106.

Figure 12:
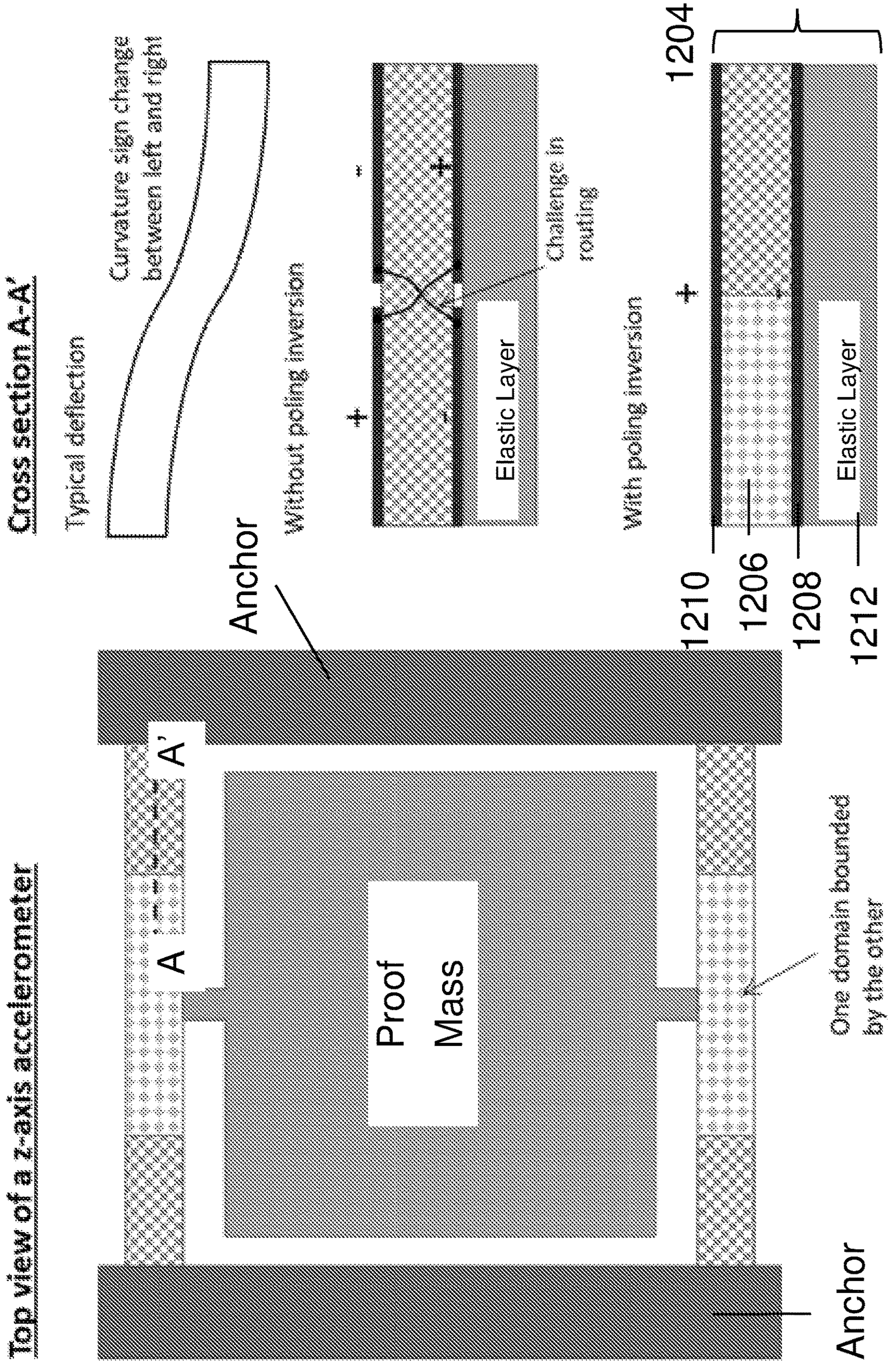
FIG. 12 shows a top view and cross-sectional side view of a piezoelectric device, i.e. an out-of-plane plane piezoelectric microelectromechanical systems (MEMS) accelerometer according to various embodiments.

This is also the case for out-of-plane sensors such as the accelerometer shown in FIG. 12. FIG. 12 shows a top view and cross-sectional side view of a piezoelectric device, i.e. an out-of-plane plane piezoelectric microelectromechanical systems (MEMS) accelerometer according to various embodiments. The accelerometer may include a layered stacked arrangement 1204 including a piezoelectric layer 1206 with poled inverted domains, a first electrode 1208 on a first side of the piezoelectric layer 1206, as well as a second electrode 1210 on a second side of the piezoelectric layer 1206 opposite the first side. The stacked layered arrangement 1204 may also include a further layer 1212. As shown in FIG. 12, a piezoelectric layer without poling inversions may require two sets of electrodes, which may cause challenges in electrical routing.

Figure 13:
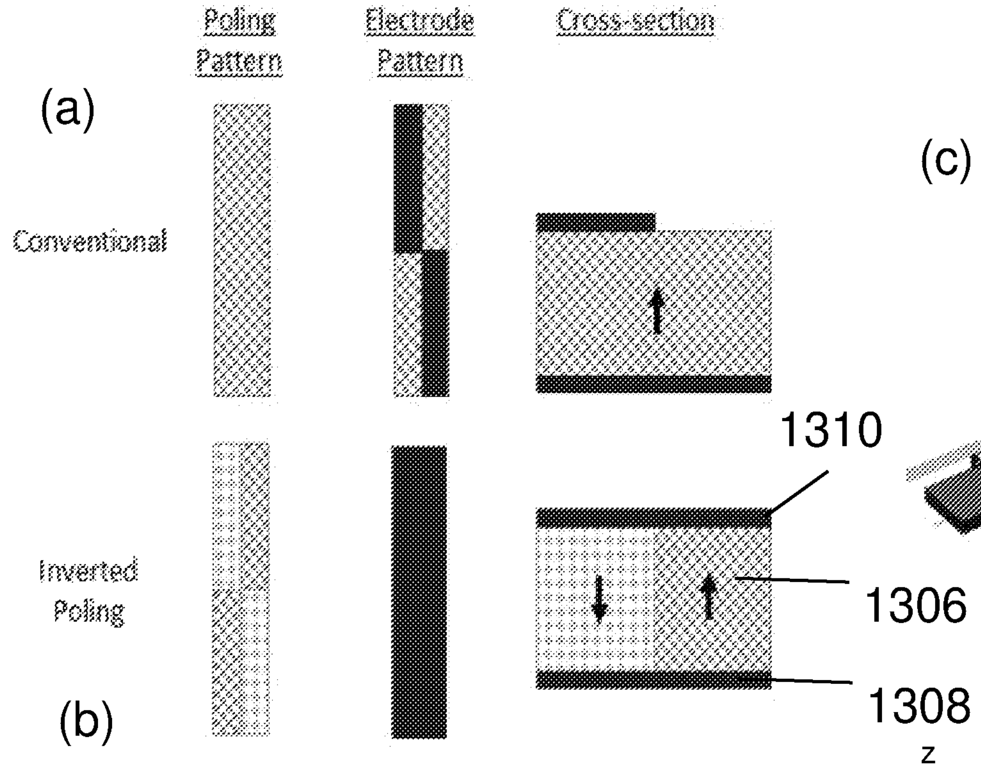
FIG. 13 shows (a) a comparison between an example accelerometer according to various embodiments, and a conventional accelerometer; (b) a comparison of simulated output of the conventional accelerometer and the accelerometer with inverted poling according to various embodiments for a 1 g input acceleration; and (c) a perspective view of the example accelerometer according to various embodiments.
Figure 13:
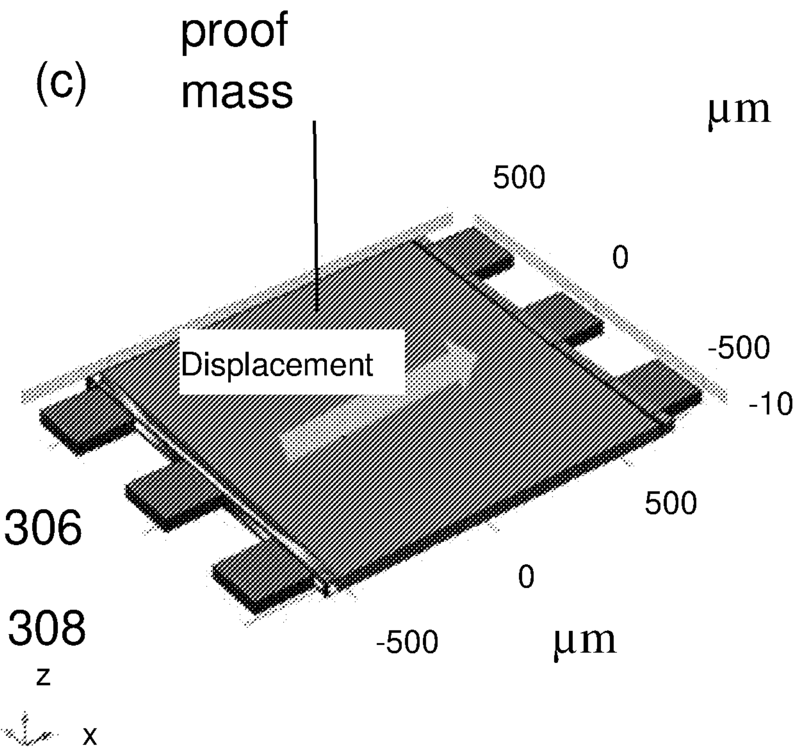

FIG. 13 shows (a) a comparison between an example accelerometer according to various embodiments, and a conventional accelerometer; (b) a comparison of simulated output of the conventional accelerometer and the accelerometer with inverted poling according to various embodiments for a 1 g input acceleration; and (c) a perspective view of the example accelerometer according to various embodiments. The example accelerometer has a proof mass of made of a silicon. Fixed-guided beam springs are used to suspend the proof mass from the four corners from two anchors, allowing the proof mass to move primarily in the x-direction, but are stiff in the other directions for minimized cross-axis sensitivity. Four piezoelectric sensing regions are also present, but decoupled from the springs, and are designed to be much stiffer in the x-direction compared to the beam springs. When an acceleration is applied in the x-direction, the force acts mainly on the piezoelectric sensing regions and not the springs, but when an acceleration is applied in the other directions, however, the force acts mainly on the springs and not the piezoelectric sensing regions. The accelerometer in FIG. 13 shows a displacement under a +1 g x-direction acceleration.

Each piezoelectric sensing region is designed to use a piezoelectric layer 1306 which includes two domains poled in different directions, corresponding to the in-plane bending stress profile. The electrodes 1308, 1310 may be made of Pt, Mo, or Al, and may be thin compared to the thickness of the piezoelectric layer 1306 such that most of the force is exerted on the piezoelectric layer 1306. Compared to the conventional method of using a single-poled domain, the inverted poling configuration according to various embodiments may provide significant increase in sensitivity and performance. Moreover, the multiple sensing regions may be electrically connected in series to boost the output voltage (at the expense of a smaller device capacitance). This may be useful if integrated with CMOS with parasitic path capacitances much smaller than the device capacitance.

Figure 14A:
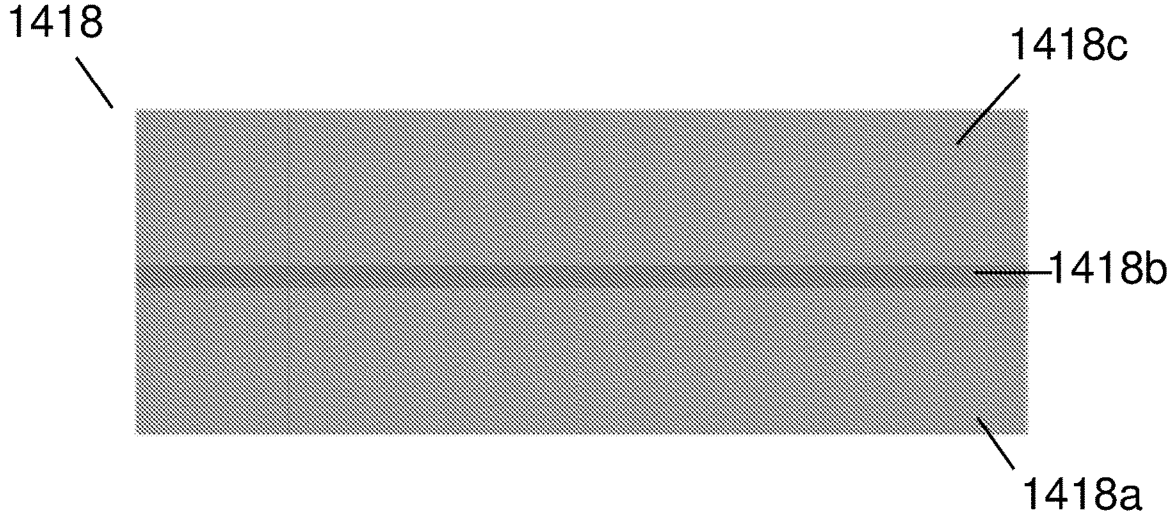
FIG. 14A is a schematic showing a silicon-on-insulator wafer.

FIGS. 14A-F show the fabrication of an accelerometer according to various embodiments. FIG. 14A is a schematic showing a silicon-on-insulator wafer 1418. The wafer may include a bottom silicon layer 1418*a*, a silicon oxide layer 1418*b* on the bottom silicon layer 1418*a*, and a top silicon layer 1418*c* on the silicon oxide layer 1418*b*. The top silicon layer 1418*c* may be used to form the device layer, and may have a thickness of 10-100 μm. A thick top silicon layer 1418*c* may be able to achieve a large proof mass.

Figure 14B:
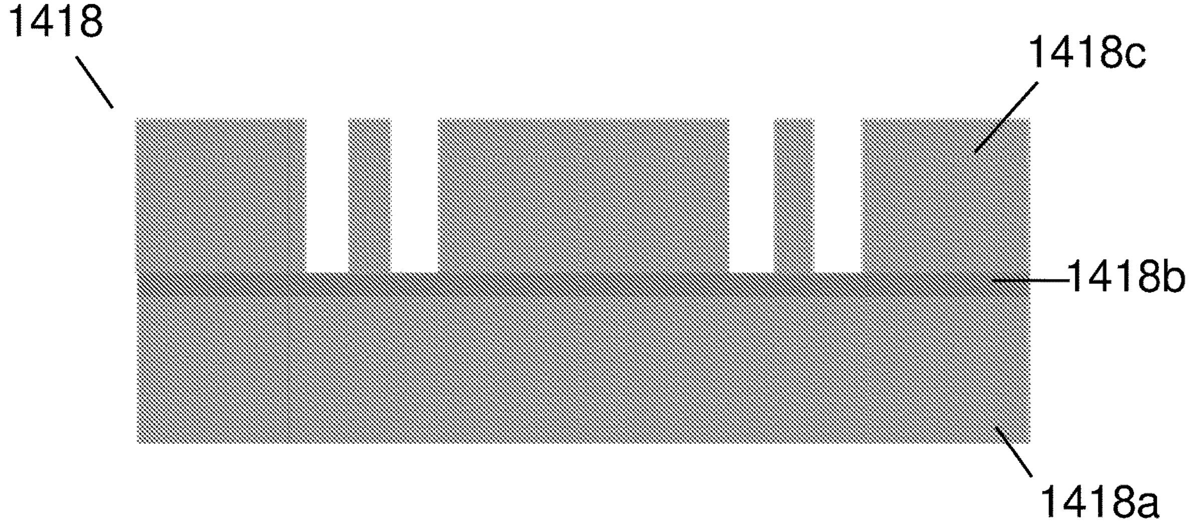
FIG. 14B is a schematic showing the fabrication of the top silicon layer according to various embodiments.

FIG. 14B is a schematic showing the fabrication of the top silicon layer 1418*c* according to various embodiments. Narrow trenches (<2 μm) are etched in the device layer 1418*c* to define the springs and the proof mass. For releasing the device, the proof mass may have holes etched in it to shorten the release-etch time.

Figure 14C:
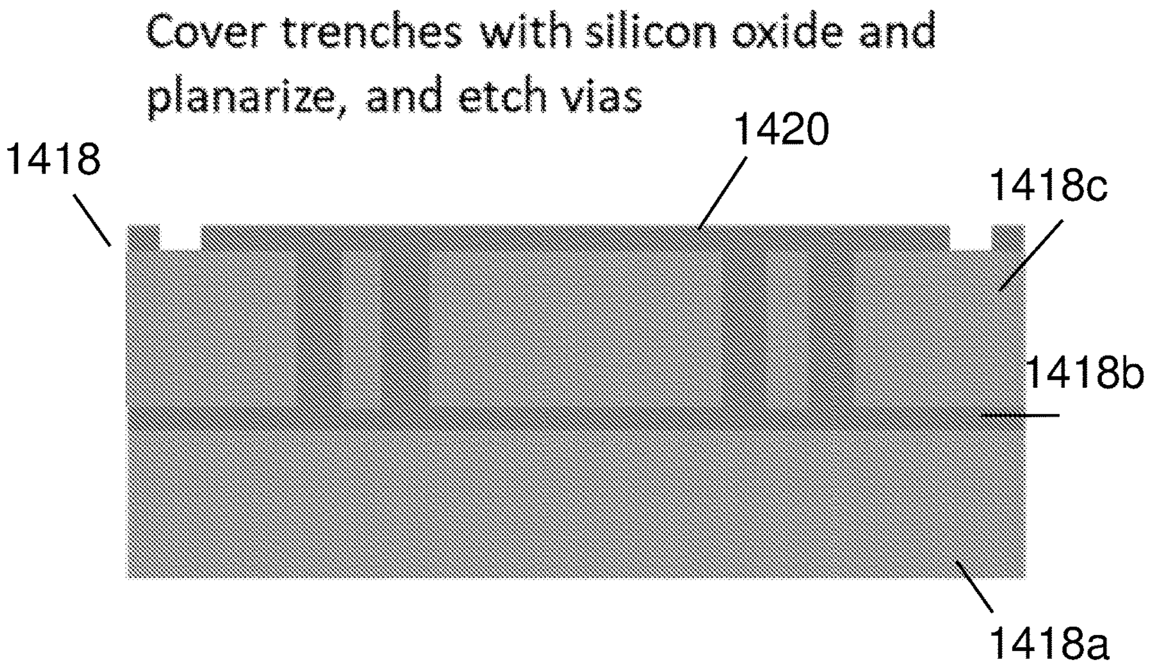
FIG. 14C is a schematic showing the covering of the etched trenches with silicon oxide according to various embodiments.

FIG. 14C is a schematic showing the covering of the etched trenches with silicon oxide according to various embodiments. The trenches may be covered by depositing a layer 1420 of silicon oxide, about 0.5-5 μm thick, such as by low pressure chemical vapour deposition (LPCVD), and the oxide surface may then be planarized with chemical mechanical polishing before forming the piezoelectric stack. Vias may be etched in the oxide layer 1420 to allow for electrical connection as well as mechanical anchoring of the piezoelectric stack.

Figure 14D:
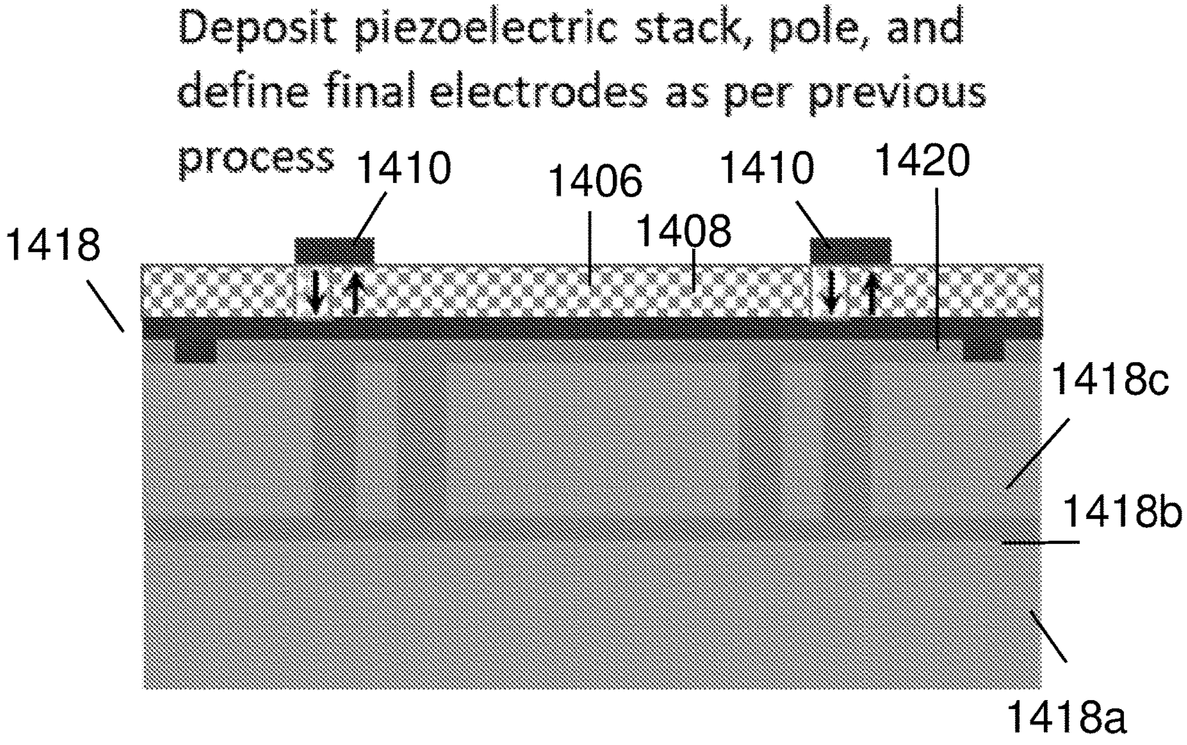
FIG. 14D is a schematic showing the forming of the piezoelectric stack according to various embodiments.

FIG. 14D is a schematic showing the forming of the piezoelectric stack according to various embodiments. The piezoelectric stack layer 1406 with bottom electrode 1408 and top electrode 1410) may be formed via deposition. The piezoelectric layer 1406 may be poled on the wafer level according to methods as described herein.

Figure 14E:
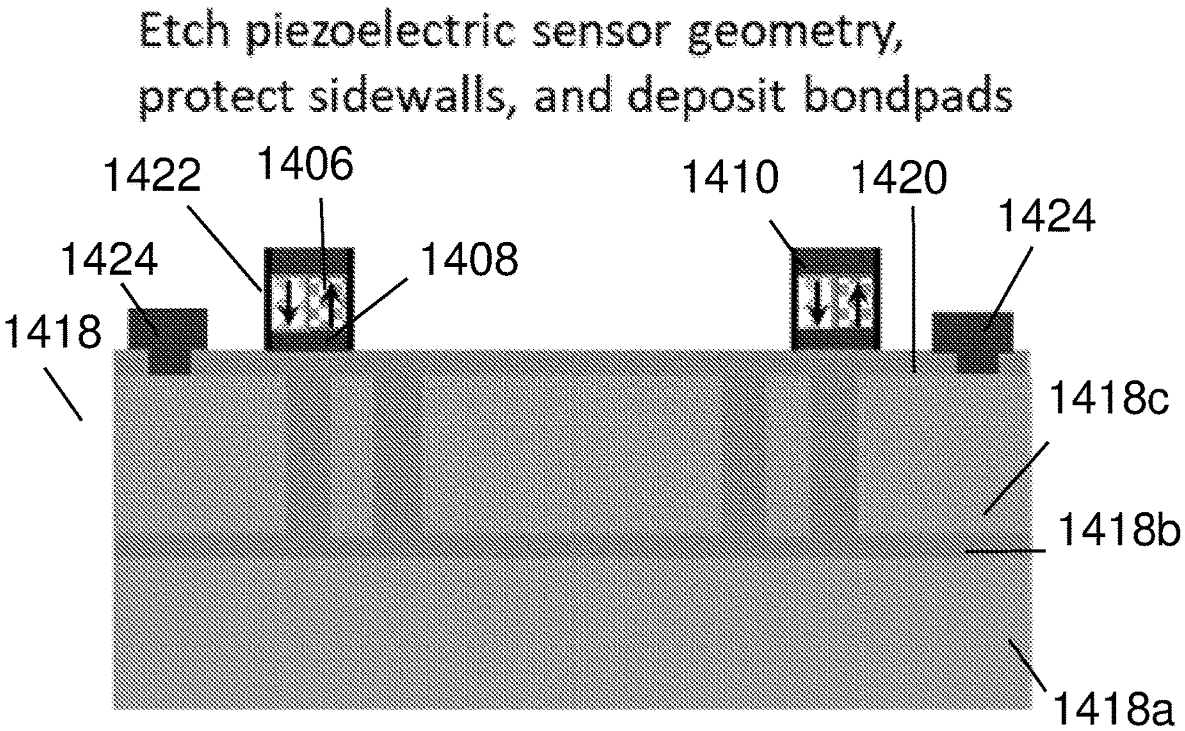
FIG. 14E is a schematic showing the patterning of the piezoelectric stack to form sensors according to various embodiments.
Figure 14F:
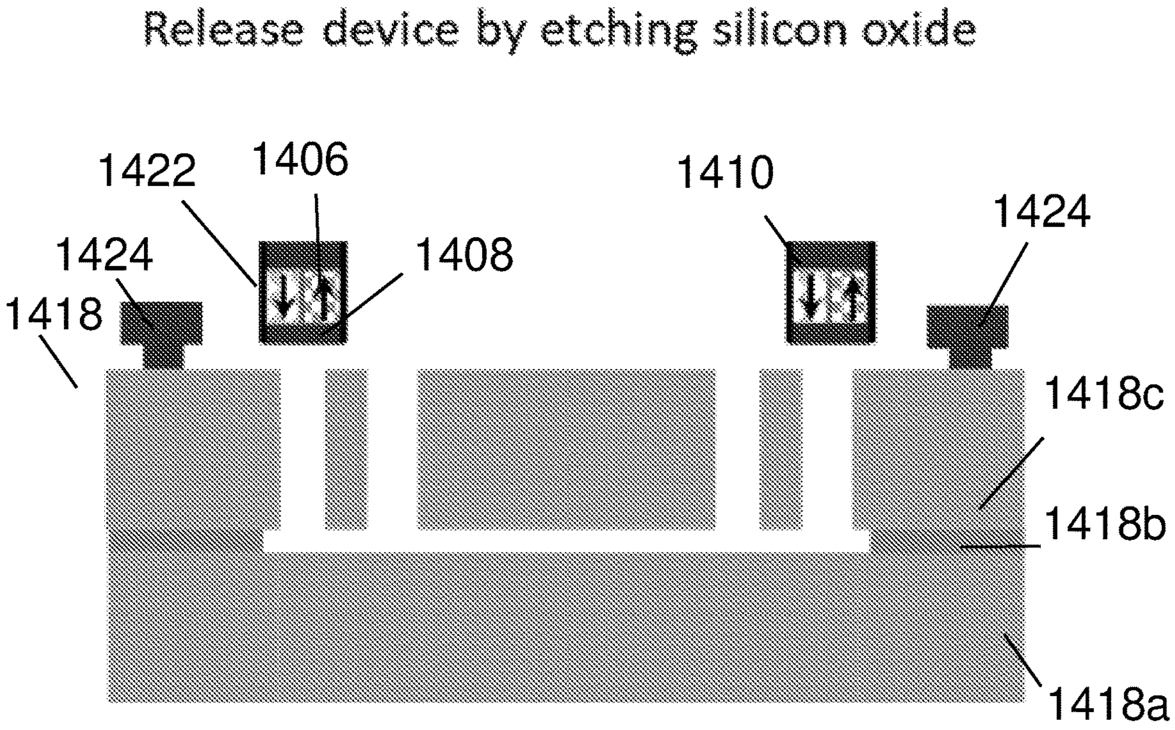
FIG. 14F is a schematic showing the releasing of the piezoelectric device according to various embodiments.

FIG. 14E is a schematic showing the patterning of the piezoelectric stack to form sensors according to various embodiments. The piezoelectric sensor geometry may be defined, and a thin layer 1422 (<200 nm) of protective material such as atomic layer deposited aluminium oxide ($Al_2O_3$) may be coated and directionally etched to protect the sidewalls of the piezoelectric stack. Bond pads 1424 may be formed by depositing a metal such as gold (Au) or aluminium (Al) in a lift-off process. FIG. 14F is a schematic showing the releasing of the piezoelectric device according to various embodiments. The device may be released using a vapour hydrogen fluoride (HF) timed etch. The individual dies may then be singulated using stealth laser dicing without need for poling post-process.

Various embodiments may relate to a piezoelectric device including a piezoelectric layer, one or more first electrodes on a first side of the piezoelectric layer, and one or more second electrodes on a second side of the piezoelectric layer opposite the first side. The piezoelectric device may include an elastic layer on one the side of the piezoelectric layer. The piezoelectric device may be anchored on a substrate at some location. The piezoelectric layer may include a first region including one or more dipole domains in a first direction. The piezoelectric layer may include a second region including one or more dipole domains in a second direction opposite the first direction.

In various embodiments, the piezoelectric device may be configured to operate in a flexural mode with regions of opposite curvature displacements, and where the dipole regions are aligned substantially with the regions of opposite curvature displacements. The one of the dipole domain regions may be substantially bounded by the opposite dipole domain region or free space, with the first and second electrodes both extending over at least part of each of the opposite dipole regions. The piezoelectric device may be a sensor or an actuator.

In various embodiments, the domain inversion may lead to an increased actuator displacement or larger receive sensitivity. In various embodiments, electrical routing difficulties may be addressed. Common flexural structures such as fixed-guided beams or membranes used in accelerometers or acoustic transducers operate with regions of opposite curvature; with one region bound by the other. Routing with conventional methods results in cancellation effects, or the need to separate the bottom electrode over each region and have vias to connect, which are often not possible due to process limitations (minimum feature sizes, patterned bottom electrode causing poor piezoelectric performance before deposition). Various embodiments may address these issues.

In various embodiments, the elastic layer may also be piezoelectric or ferroelectric, and may include domain inversions. The elastic layer may be electrically conductive and may serve as one of the electrodes on the piezoelectric layer.

In various embodiments, the piezoelectric layer may include regions that are non-uniformly poled (regions where dipoles are more aligned than others).

In various embodiments, the piezoelectric layer may be a polycrystalline layer, deposited via physical vapour deposition. In various embodiments, polycrystalline piezoelectrics may be useful for sensors and actuators. Polycrystalline piezoelectrics may have a benefit of mechanical isotropy and fabrication ease by means such as PVD or sol-gel. This isotropy may be critical for the design of devices such as gyroscopes. Various embodiments may be coupled to features such as a proof mass, or acoustic coupling material for the purposes of sensing and actuation.

In various embodiments, the piezoelectric layer may have inverted domains. In various embodiments, there may be a gap or different material between the different dipole regions, at least partially through the piezoelectric layer. The different material may have a lower dielectric constant than the piezoelectric layer.

In reported applications of resonators and optics with domain inversions, gaps or such defects are undesirable for optics or resonators as these are defects that lower the device performance. Grain boundaries of polycrystalline materials are also not preferable. However, for flexural mode applications, the losses may often be dominated by other effects (such as the desired transfer of energy to the acoustic medium for pMUTs), therefore single-crystal materials may provide negligible benefits. There may instead be beneficial effects to having gaps for the inverted poling structure: a) provides increased electrical isolation during poling for better inversion, b) larger actuation or sensitivity, and c) less likelihood for domain depolarization for smaller domains/thinner layers.

In various embodiments, the piezoelectric layer may include a ferroelectric wurtzite-type material, such as $Sc_xAl_{1-x}N$. The piezoelectric layer may have a thickness of <5 um. For flexural mode applications, the optical properties and loss properties may not be critical. While creating stable domain inversions with thin (~um) lithium niobate films is difficult, other ferroelectric materials may be applicable to flexural mode devices, e.g. wurtzite-type materials such as ScAlN. While the higher coercive field (around ~MV/cm for ScAlN, compared to −100 kV/cm for PZT) typically makes it much more difficult to pole, it may also be less sensitive to depolarization from heat and electric fields during processing.

In various embodiments, the second electrode may include a material such as molybdenum. The second electrode may be patterned using an isotropic etch in mild conditions. Electrode materials that are commonly used for piezoelectrics such as PZT include platinum, gold, and aluminium. However, often the patterning or removal of these materials over the piezoelectric involves ion etching (anisotropic etch), which risks depolarizing the piezoelectric.

Molybdenum can be etched by $XeF_2$ isotropic dry etch in mild conditions, while not etching piezoelectric materials such as PZT and many other materials, and may be suited for use as the electrode to lower the risk of depolarization of the ferroelectric after poling during the modification of the second electrode.

Various embodiments may relate to a method of forming a piezoelectric device. The method may include forming the piezoelectric stack on a substrate. The piezoelectric stack may include a first electrode on a substrate, a piezoelectric layer, and a second electrode on the piezoelectric layer. The method may include patterning the second electrode and applying one or more potential differences between the first electrode and the patterned second electrode so that the piezoelectric layer includes different dipole regions. The method may also include modifying the second electrode such that it extends over at least two dipole regions with inverted polarity, where one of the dipole domain regions is substantially bounded by the opposite dipole domain region or free space.

The challenges of modifying the second electrode after poling, and the challenge of applying the desired electric fields at the boundaries have been discussed above. Together with the structural features described herein, the challenges can be overcome. This process of poling with the second electrodes after forming the piezoelectric layer on the substrate may ensure excellent lithographic alignment of the different layers for MEMS that are required for high performance devices.

Although it is possible to bond poled lithium niobate to a substrate, bonding has poorer control over the alignment to the substrate (typically >2 um), compared to <200 nm for lithographic stepper alignment.

In various embodiments, domain inversion may be used to achieve metrics such as larger output displacements or lower voltages, larger input sensitivities, and ease of electrical routing. Various embodiments may have ~2 times larger displacement per volt.

Various embodiments generate a single-phase acoustic wave using the combined effect of both inverted and non-inverted regions. For the acoustic reception of a plane wave, the proposed pMUT structure described herein may be able to generate a larger combined signal with both inverted and non-inverted regions.

Various embodiments may relate to the out-of-plane poling of the piezoelectric layer. The poling process may be performed across multiple devices with temporary traces—these traces may then be modified by the removal and/or addition of new traces prior to dicing. The new traces thus defined may not need to be across dicing lanes.

By "comprising" it is meant including, but not limited to, whatever follows the word "comprising". Thus, use of the term "comprising" indicates that the listed elements are required or mandatory, but that other elements are optional and may or may not be present.

By "consisting of" is meant including, and limited to, whatever follows the phrase "consisting of". Thus, the phrase "consisting of" indicates that the listed elements are required or mandatory, and that no other elements may be present.

The inventions illustratively described herein may suitably be practiced in the absence of any element or elements, limitation or limitations, not specifically disclosed herein. Thus, for example, the terms "comprising", "including", "containing", etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the inventions embodied therein herein disclosed may be resorted to by those skilled in the art, and that such modifications and variations are considered to be within the scope of this invention.

By "about" in relation to a given numerical value, such as for temperature and period of time, it is meant to include numerical values within 10% of the specified value.

The invention has been described broadly and generically herein. Each of the narrower species and sub-generic groupings falling within the generic disclosure also form part of the invention. This includes the generic description of the invention with a proviso or negative limitation removing any subject matter from the genus, regardless of whether or not the excised material is specifically recited herein.

Other embodiments are within the following claims and non-limiting examples.

The invention claimed is:

1. A piezoelectric device comprising:
a substrate; and
a layered stacked arrangement anchored to the substrate, the layered stacked arrangement comprising:
a piezoelectric layer;
a first electrode on a first side of the piezoelectric layer; and
a second electrode on a second side of the piezoelectric layer opposite the first side;
wherein the piezoelectric layer comprises a first region comprising one or more dipole domains of a first type;

wherein the piezoelectric layer comprises a second region comprising one or more dipole domains of a second type;
wherein the first electrode is at least partially in contact with the first region and at least partially in contact with the second region;
wherein the second electrode is at least partially in contact with the first region and at least partially in contact with the second region;
wherein the piezoelectric device is a sensor or an actuator;
wherein during operation, at least 50% of the first region is configured to have a positive curvature and at least 50% of the second region is configured to have a negative curvature;
wherein the piezoelectric device further comprises a gap material between the first region and the second region; and
wherein the gap material has a dielectric constant lower than a dielectric constant of a piezoelectric material of the piezoelectric layer.

2. The piezoelectric device according to claim 1,
wherein the one or more dipole domains of the first type are aligned in a first direction; and
wherein the one or more dipole domains of the second type are aligned in a second direction opposite the first direction.

3. The piezoelectric device according to claim 1,
wherein the one or more dipole domains of the first type or the one or more dipole domains of the second type are non-uniformly poled.

4. The piezoelectric device according to claim 1,
wherein the first electrode or the second electrode is an elastic layer.

5. The piezoelectric device according to claim 1,
wherein the layered stacked arrangement comprises a further layer such that the first electrode or the second electrode is between the piezoelectric layer and the further layer.

6. The piezoelectric device according to claim 5,
wherein the further layer is electrically conductive or electrically semiconductive.

7. The piezoelectric device according to claim 5,
wherein the further layer is electrically insulating.

8. The piezoelectric device according to claim 5,
wherein the further layer is a further piezoelectric layer.

9. The piezoelectric device according to claim 1,
wherein the piezoelectric layer is polycrystalline.

10. The piezoelectric device according to claim 1,
where the piezoelectric layer comprises a ferroelectric wurtzite-type material.

11. The piezoelectric device according to claim 1,
where the piezoelectric layer has a thickness of a value less than 5 μm.

12. The piezoelectric device according to claim 1,
wherein the first electrode or the second electrode comprises molybdenum; and
wherein the molybdenum is patterned using an isotropic etch.

13. A method of forming a piezoelectric device, the method comprising:
forming a layered stacked arrangement anchored to a substrate, the layered stacked arrangement comprising:
a piezoelectric layer;
a first electrode on a first side of the piezoelectric layer; and
a second electrode on a second side of the piezoelectric layer opposite the first side;
wherein the piezoelectric layer comprises a first region comprising one or more dipole domains of a first type;
wherein the piezoelectric layer comprises a second region comprising one or more dipole domains of a second type;
wherein the first electrode is at least partially in contact with the first region and at least partially in contact with the second region;
wherein the second electrode is at least partially in contact with the first region and at least partially in contact with the second region;
wherein the piezoelectric device is a sensor or an actuator;
wherein during operation, at least 50% of the first region is configured to have a positive curvature and at least 50% of the second region is configured to have a negative curvature;
wherein the piezoelectric device further comprises a gap material between the first region and the second region; and
wherein the gap material has a dielectric constant lower than a dielectric constant of a piezoelectric material of the piezoelectric layer.

14. The method according to claim 13,
wherein the first electrode is formed on the substrate before forming the piezoelectric layer;
wherein the method comprises forming one or more temporary electrodes on the second side of the piezoelectric layer before forming the second electrode;
wherein the method also comprises applying one or more potential differences between the first electrode and the one or more temporary electrodes so that the piezoelectric layer comprises the first region and the second region; and
wherein the one or more temporary electrodes are removed before forming the second electrode, or the one or more temporary electrodes are modified to form the second electrode.

15. The method according to claim 14,
wherein the piezoelectric layer is initially unpoled.

16. The method according to claim 15,
wherein the piezoelectric layer initially comprises dipole domains of the first type or of the second type.

17. The method according to claim 14,
wherein forming the piezoelectric layer comprises using a shadow mask for allowing electrical access to the first electrode.

18. The method according to claim 14,
wherein the method further comprises etching the piezoelectric layer before forming the second electrode for allowing electrical access to the first electrode.

19. The method according to claim 13,
wherein the substrate is patterned before forming the piezoelectric layer; or
wherein the substrate is a silicon-on-insulator (SOI) wafer.

* * * * *